(12) United States Patent
Torimoto et al.

(10) Patent No.: US 12,151,947 B2
(45) Date of Patent: Nov. 26, 2024

(54) SEMICONDUCTOR NANOPARTICLES AND METHOD FOR PRODUCING SAME

(71) Applicants: National University Corporation Tokai National Higher Education and Research System, Nagoya (JP); OSAKA UNIVERSITY, Suita (JP); NICHIA CORPORATION, Anan (JP)

(72) Inventors: Tsukasa Torimoto, Nagoya (JP); Tatsuya Kameyama, Nagoya (JP); Susumu Kuwabata, Ibaraki (JP); Taro Uematsu, Suita (JP); Daisuke Oyamatsu, Tokushima (JP)

(73) Assignees: National University Corporation Tokai National Higher Education and Research System, Nagoya (JP); OSAKA UNIVERSITY, Suita (JP); NICHIA CORPORATION, Anan (JP)

( * ) Notice: Subject to any disclaimer, the term of this patent is extended or adjusted under 35 U.S.C. 154(b) by 670 days.

(21) Appl. No.: 17/310,482

(22) PCT Filed: Feb. 7, 2020

(86) PCT No.: PCT/JP2020/004950
§ 371 (c)(1),
(2) Date: Aug. 5, 2021

(87) PCT Pub. No.: WO2020/162622
PCT Pub. Date: Aug. 31, 2020

(65) Prior Publication Data
US 2022/0089452 A1    Mar. 24, 2022

(30) Foreign Application Priority Data

Feb. 8, 2019  (JP) ................................. 2019-021769
Aug. 26, 2019  (JP) ................................. 2019-153620

(51) Int. Cl.
| | | |
|---|---|---|
| C01G 15/00 | (2006.01) | |
| B82Y 20/00 | (2011.01) | |
| B82Y 40/00 | (2011.01) | |
| C09K 11/58 | (2006.01) | |
| C09K 11/62 | (2006.01) | |
| H01L 33/50 | (2010.01) | |

(52) U.S. Cl.
CPC .......... *C01G 15/006* (2013.01); *C09K 11/582* (2013.01); *C09K 11/621* (2013.01); *B82Y 20/00* (2013.01); *B82Y 40/00* (2013.01); *C01P 2004/30* (2013.01); *C01P 2004/64* (2013.01); *C01P 2006/60* (2013.01); *H01L 33/502* (2013.01)

(58) Field of Classification Search
CPC ... C01G 15/006; H01L 33/502; C09K 11/582; C09K 11/621
See application file for complete search history.

(56) References Cited

U.S. PATENT DOCUMENTS

| | | |
|---|---|---|
| 2009/0159849 A1 | 6/2009 | Uehara et al. |
| 2010/0193806 A1 | 8/2010 | Byun |
| 2020/0006601 A1 | 1/2020 | Torimoto et al. |

FOREIGN PATENT DOCUMENTS

| | | |
|---|---|---|
| JP | 2002176166 A | 6/2002 |
| JP | 2007169605 A | 7/2007 |
| JP | 2010013313 A | 1/2010 |
| JP | 2010177656 A | 8/2010 |
| JP | 2012212862 A | 11/2012 |
| JP | 2018039971 A | 3/2018 |
| JP | 2018141141 A | 9/2018 |
| WO | 2014129067 A1 | 8/2014 |
| WO | 2014164495 A1 | 10/2014 |
| WO | 2014164497 A1 | 10/2014 |
| WO | 2018220160 A1 | 12/2018 |

OTHER PUBLICATIONS

Mohan et al, "Influence of silver precursor concentration on structural, optical and morphological properties of Cu1—xAgxInS2 semicondutor nanocrystals", J. alloy and Compound, 729, (2017), 407-417, Sep. 8, 2017.*

Aldakov, D., et al., Ternary and Quaternary metal chalcogenide nanocrystals: synthesis, properties and applications, Journal of Materials Chemistry C, vol. 1, No. 24, Jan. 1, 2013, pp. 3756-3776, 22 pages.

De Trizio, L., et al., Strongly Fluorescent Quaternary Cu—In—Zn—S Nanocrystals Prepared from $Cu_{1-x}InS_2$ Nanocrystals by Partial Cation Exchange, Chemistry of Materials, vol. 24, No. 12, Jun. 7, 2012, pp. 2400-2406, 7 pages.

Haizheng, Z., et al., Tuning the Luminescence Properties of Colloidal I-III-VI Semiconductor Nanocrystals for Optoelectronics and Biotechnology Applications, The Journal of Physical Chemistry Letters, vol. 3, No. 21, Nov. 1, 2012, pp. 3167-3175,9 pages.

Hamanaka, Y., et al., Enhancement of Donor-Acceptor Pair Emissions in Colloidal AgInS2 Quantum Dots with High Concentrations of Defects, The Journal of Physical Chemistry C, vol. 118, No. 26, Jun. 19, 2014, pp. 14562-14568, 7 pages.

Lee, S.J., et al., Rapid and facile synthesis of a $(Zn_xAg_yIn_z)S_2$ nanocrystal library via sono-combichem method and its characterization including single nanocrystal analysis, Journal of Materials Chemistry, vol. 22, No. 24, Jan. 1, 2012, pp. 11957-11963, 7 pages.

(Continued)

*Primary Examiner* — C Melissa Koslow
(74) *Attorney, Agent, or Firm* — Hunton Andrews Kurth LLP

(57) ABSTRACT

Provided is a method for producing a semiconductor nanoparticle including preparing a mixture containing a Ag salt, a salt containing at least one of In and Ga, and an organic solvent; raising the temperature of the mixture to a raised temperature in a range of from 120° C. to 300° C.; and adding a supply source of S to the mixture at the raised temperature in such a manner that a ratio of a number of S atoms to a number of Ag atoms in the mixture increases at a rate of not more than 10/min.

21 Claims, 10 Drawing Sheets

(56) References Cited

OTHER PUBLICATIONS

Jematsu, T., et al., Narrow band-edge photoluminescence from AgInS2 semiconductor nanoparticles by the formation of amorphous III-VI semiconductor shells, NPG Asia Materials, Aug. 7, 2018, vol. 10, 713-726, 14 pages.

Hoisang, W., et al., Core nanoparticle engineering for narrower and more intense band-edge emission form AgInS2/GaSx core/shell quantum dots, nanomaterials, Dec. 11, 2019, vol. 9, 1763, 16 pages.

* cited by examiner

SEMICONDUCTOR NANOPARTICLES AND METHOD FOR PRODUCING SAME

CROSS-REFERENCE TO RELATED APPLICATIONS

This application is a national stage application filed under 35 U.S.C. § 371 based on International Patent Application No. PCT/JP2020/004950, filed on Feb. 7, 2020, which claims priority to Japanese Patent Application No. 2019-021769 filed on Feb. 8, 2019 and Japanese Patent Application No. 2019-153620 filed on Aug. 26, 2019, the disclosures of which are incorporated herein by reference in their entirety.

TECHNICAL FIELD

The present invention relates to semiconductor nanoparticles and a method for producing the same.

BACKGROUND ART

Semiconductor particles with a particle diameter of, for example, 10 nm or less are known to exhibit a quantum size effect, and such nanoparticles are referred to as "quantum dots" (also referred to as "semiconductor quantum dots"). The quantum size effect is a phenomenon where a valence band and a conduction band, each of which is regarded as continuous in bulk particles, become discrete in nanoparticles, and the bandgap energy varies in accordance with the particle diameter.

Quantum dots may absorb light and change the wavelength of the light corresponding to the bandgap energy. Thus, white light-emitting devices using emission of quantum dots are proposed (e.g., refer to Japanese Unexamined Patent Application Publications No. 2012-212862 and No. 2010-177656). More specifically, light emitted from a light-emitting diode (LED) chip is partially absorbed by quantum dots, and the emission from the quantum dots and the light from the LED chip are mixed to produce white light. In these patent documents, use of binary quantum dots in Group 12-Group 16, such as CdSe or CdTe, or Group 14-Group 16, such as PbS or PhSe, is proposed. Also, in view of the toxicity of compound's containing Cd and Pb, a wavelength conversion film using core-shell structured semiconductor quantum dots not containing these elements is proposed (e.g., refer to International Patent Publication No. WO 2014/129067).

SUMMARY OF THE INVENTION

Problems to be Solved by the Invention

As the core of core-shell quantum dots, semiconductor nanoparticles with a narrow particle size distribution are desired in view of the light emission properties. An aspect of the present disclosure is to provide a method for producing semiconductor nanoparticles capable of producing semiconductor nanoparticles with a narrow particle size distribution.

Means for Solving the Problem

A first aspect is a method for producing semiconductor nanoparticles including preparing a mixture containing a silver (Ag) salt, a salt containing at least one of indium (In) and gallium (Ga), and an organic solvent; raising the temperature of the mixture to a raised temperature in the range of from 120° C. to 300°; and adding a supply source of sulfur (S) to the mixture at the raised temperature in such a manner that a ratio of a number of S atoms to a number of Ag atoms in the mixture increases at a rate of not more than 10/min.

A second aspect is a method for producing semiconductor nanoparticles including preparing a mixture containing a silver (Ag) salt, a copper (Cu) salt, a salt containing at least one of indium (In) and gallium (Ga), and an organic solvent; raising the temperature of the mixture to a raised temperature in the range of from 120° C. to 300° C.; and adding a supply source of sulfur (S) to the mixture at the raised temperature in such a manner that a ratio of a number of S atoms to a sum of a number of Ag atoms and a number of Cu atoms in the mixture increases at a rate of not more than 10/min.

A third aspect is a semiconductor nanoparticle containing silver (Ag), copper (Cu), at least one of indium (In) and gallium (Ga), and sulfur (S), wherein a ratio of a number of Cu atoms to a total number of Ag atoms and Cu atoms is from 0.001 to 0.9, and upon irradiation of light having a wavelength in the range of from 350 nm to less than 500 nm, the semiconductor nanoparticle emits light with a longer wavelength than the light irradiated.

A fourth aspect is a core-shell semiconductor nanoparticle including a core and a shell disposed on the surface of the core, the core containing a semiconductor nanoparticle containing silver (Ag), copper (Cu), at least one of indium (In) and gallium (Ga), and sulfur (S), wherein a ratio of a number of Cu atoms to a total number of Ag atoms and Cu atoms is from 0.001 to 0.9, and the shell containing a semiconductor material essentially consisting of at least one Group 13 element and at least one Group 16 element. The core-shell semiconductor nanoparticle emits light having a peak emission wavelength in the range of from 500 nm to 820 nm and a spectral half bandwidth of 250 meV or less upon irradiation of light having a wavelength in the range of from 350 nm to less than 500 nm.

A fifth aspect is a light-emitting device including a light conversion member containing the semiconductor nanoparticle and a semiconductor light-emitting element.

Advantageous Effect of the Invention

According to an aspect of the present disclosure, a method for producing semiconductor nanoparticles capable of producing semiconductor nanoparticles with a narrow particle size distribution can be provided.

DETAILED DESCRIPTION

Mode for Carrying Out the Invention

Figure 1:
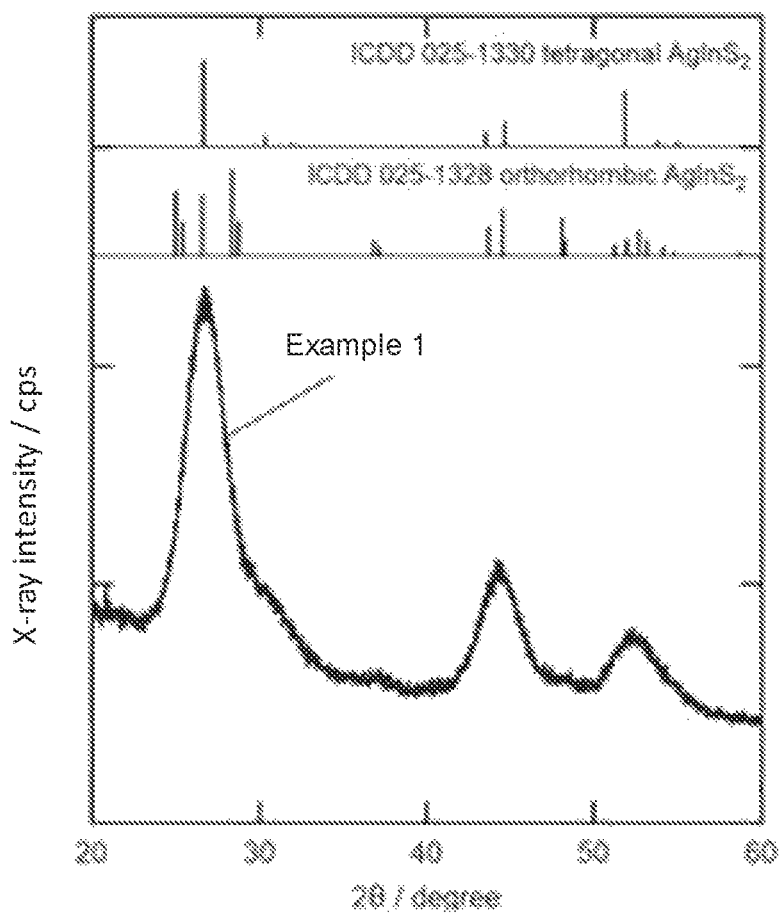
FIG. 1 shows an exemplary X-ray diffraction (XRD) pattern of semiconductor nanoparticles according to Example 1.

As used herein, the term "step" means not only an independent step but also a step which may not be clearly distinguished from the other steps but that may achieve the desired object. When a plurality of substances corresponding to a component are present in a composition, the amount of the component means the total amount of the corresponding substances present in the composition unless otherwise specified. The embodiments will now be described in detail. However, the embodiments described below are mere examples of the semiconductor nanoparticles and the method for producing the same for embodying the technical concept of the present invention, and the present invention is not limited to the semiconductor nanoparticles and the method for producing the same described below.

Method for Producing Semiconductor Nanoparticles

The first aspect of the method for producing semiconductor nanoparticles includes a preparation step of preparing a mixture containing an Ag salt, a salt containing at least one of In and Ga, and an organic solvent; a temperature raising step of raising the temperature of the mixture to a raised temperature in the range of from 120° C. to 300° C.; and an addition step of adding a supply source of S to the mixture whose temperature has been raised in such a manner that the ratio of the number of S atoms to the number of Ag atoms in the mixture increases at a rate of not more than 10/min.

By preparing a mixture containing other elements than S of the elements for forming the semiconductor nanoparticles and an organic solvent beforehand, and, while maintaining the temperature of the mixture being raised, slowly adding a stoichiometric amount of a supply source of S into the mixture in such a manner that the ratio of the number of S atoms to the number of Ag atoms in the mixture increases at a rate of not more than 10/min, semiconductor nanoparticles with a narrow particle size distribution can be produced. This is probably because, for example, the concentration of S being maintained sufficiently low in the reaction solution for producing semiconductor nanoparticles suppresses the particle growth of the semiconductor nanoparticles, especially silver sulfide nanoparticles, or the intermediate product.

The second aspect of the method for producing semiconductor nanoparticles includes a preparation step of preparing a mixture containing an Ag salt, a salt containing at least one of In and Ga, and an organic solvent; a temperature raising step of raising the temperature of the mixture to a raised temperature in the range of from 120° C. to 300° C.; and an addition step of adding a supply source of S to the mixture whose temperature has been raised in such a manner that the ratio of the number of S atoms to the total number of Ag and Cu atoms in the mixture increases at a rate of not more than 10/min.

By preparing a mixture containing elements other than S of the elements for forming the semiconductor nanoparticles and an organic solvent beforehand, and, while maintaining the temperature of the mixture raised, slowly adding a supply source of S in a stoichiometric amount to the mixture in such a manner that the ratio of the number of S atoms to the total number of Ag and Cu atoms in the mixture increases at a rate of not more than 10/min, semiconductor nanoparticles with a narrow particle size distribution can be produced. This is probably because, for example, the concentration of S being maintained sufficiently low in the reaction solution for producing semiconductor nanoparticles suppresses the particle growth of the semiconductor nanoparticles, especially silver sulfide nanoparticles, or the intermediate product.

Preparation Step

In the preparation step of the first aspect, a mixture containing an Ag salt, a salt containing at least one of In and Ga, and an organic solvent (hereinafter also referred to as first mixture) is prepared. The mixture may be prepared by mixing an Ag salt and a salt containing at least one of In and Ga with an organic solvent. The mixture may also be prepared by mixing an Ag salt or a salt containing at least one of In and Ga with an organic solvent and then mixing the remaining components. The resulting mixture may be in a solution state with no material left undissolved at the raised temperature. The atmosphere during mixing may be an inert gas atmosphere, such as an argon atmosphere or a nitrogen atmosphere. An inert gas atmosphere may reduce or prevent generation of by-products of oxides.

In the preparation step of the second aspect, a mixture containing an Ag salt, a Cu salt, a salt containing at least one of In and Ga, and an organic solvent (hereinafter also referred to as first mixture) is prepared. The mixture may be prepared by mixing an Ag salt, a Cu salt, and a salt containing at least one of In and Ga with an organic solvent. The mixture may also be prepared by mixing an Ag salt, a Cu salt or a salt containing at least one of In and Ga with an organic solvent and then mixing the remaining components. The resulting mixture may be in a solution state with no material left undissolved at the raised temperature. The atmosphere during mixing may be an inert gas atmosphere, such as an argon atmosphere or a nitrogen atmosphere. An inert gas atmosphere may reduce or prevent generation of by-products of oxides.

Examples of the Ag salt, the Cu salt, and the salt containing at least one of In and Ga to be used in the production method include organic acid salts and inorganic acid salts.

Specific examples of the inorganic acid salts include nitrate, sulfate, hydrochloride, sulfonate, and carbonate. Specific examples of the organic acid salts include acetate and acetylacetonate salts. Among them, organic acid salts, which are highly soluble in organic solutions, are preferable.

Examples of the organic solvent include amines having a hydrocarbon group with a carbon number of from 4 to 20, particularly alkylamines or alkenylamines with a carbon number of from 4 to 20; thiols having a hydrocarbon group with a carbon number of from 4 to 20, particularly alkyithiols or alkenylthiols with a carbon number of from 4 to 20; and phosphines having a hydrocarbon group with a carbon number of from 4 to 20, particularly alkylphosphines or alkenylphosphines with a carbon number of from 4 to 2. These organic solvents may eventually surface-modify the resulting semiconductor nanoparticies. These organic solvents may be used in combination of two or more. In particular, a mixed solvent containing at least one selected from thiols having a hydrocarbon group with a carbon number of from 4 to 20 and at least one selected from amines having a hydrocarbon group with a carbon number of from 4 to 20 may be used. These organic solvents may also be mixed with other organic solvents. The organic solvents may be solid at room temperature as long as they dissolve at 120° C. or more.

The ratio of the number of Ag atoms to the total number of In and Ga atoms (Ag/(In+Ga)) in the mixture according to the first aspect may be, for example, from 0.1 to 2, and preferably from 0.5 to 1.2. The concentration of Ag in the mixture may be, for example, from 1 mmol/L to 500 mmol/L and preferably from 10 mmol/L to 50 mmol/L.

The ratio of the total number of Ag and Cu atoms to the total number of In and Ga atoms ((Ag+Cu)/(In+Ga)) in the mixture according to the second aspect may be, for example, from 0.1 to 2, and preferably from 0.5 to 1.2. The ratio of the number of Cu atoms to the total number of Ag and Cu atoms in the mixture (Cu/(Ag+Cu)) is, for example, from 0.001 to 0.9, and preferably from 0.005 to 0.5. The total concentration of Ag and Cu in the mixture may be, for example, from 1 mmol/L to 500 mmol/L, and preferably from 10 mmol/L to 50 mmol/L.

Temperature Raising Step

In the temperature raising step, the temperature of the prepared mixture may be raised to a raised temperature in the range of from 120° C. to 300° C. The temperature to be reached by the temperature raising may be preferably 125° C. or more, more preferably 130° C. or more, and still more preferably 135° C. or more. The temperature to be reached by the temperature raising is also preferably 175° C. or less, more preferably 160° C. or less, and still more preferably 150° C. or less. The temperature-raising rate may be, for example, from 1° C./min to 50° C./min, and preferably from 10° C./min to 50° C./min.

The atmosphere during raising the temperature of the mixture may be an inert gas atmosphere, such as an argon atmosphere or a nitrogen atmosphere. An inert gas atmosphere may reduce or prevent generation of by-products of oxides.

Addition Step

In the addition step according to the first aspect, a supply source of S is slowly added to the mixture whose temperature has been raised to a predetermined temperature, with the predetermined temperature being maintained, in such a manner that the ratio of the number of S atoms to the number of Ag atoms in the mixture (S/Ag ratio) increases at a rate of not more than 10/min. The rate of increase in the S/Ag ratio (S/Ag ratio) is, for example, calculated by subtracting the S/Ag ratio at a certain point in time from the S/Ag ratio at the end of the unit time, and dividing the result of subtraction by the unit time in minute. The unit time may be any of, for example, between 1 sec and 1 min. The rate of increase in the ratio of the number of S atoms to the number of Ag atoms in the mixture is preferably from 0.0001/min to 2/min, more preferably from 0.0001/min to still more preferably from 0.001/min to 0.2/min, and particularly preferably from 0.001/min to 0.1/min for controlling the particle growth of silver sulfide nanoparticles. Also, the rate is preferably from 0.0002/min to 2/min, more preferably from 0.002/min to 0.2/min, still more preferably from 0.0025/min to 0.19/min, and particularly preferably from 0.04/min to 0.12/min. The rate of increase in the S/Ag ratio may be, for example, 0.0001/min or more, preferably 0.0002/min or more, 0.001/min or more, 0.002/min or more, 0.0025/min or more, 0.005/min or more, 0.01/min or more, or 0.04/min or more. The rate of increase in the S/Ag ratio may be, for example, 5/min or less, preferably 2/min or less, 1/min or less, 0.5/min or less, 0.3/min or less, 0.25/min or less, 0.2/min or less, or 0.19/min or less.

The total amount of the supply source of S to be added according to the first aspect may be such an amount that the ratio of the number of S atoms to the number of Ag atoms in the mixture is from 0.1 to 5, and preferably from 1 to 2.5. The time required for adding the supply source of S may be, for example, 1 min or more, preferably 5 min or more, more preferably 15 min or more, and still more preferably 20 min or more. The time required may also be, for example, 120 min or less, preferably 60 min or less, and more preferably 40 ruin or less.

If the total amount of the supply source of S to be added is such that the ratio of the number of S atoms to the number of Ag atoms in the mixture is from 0.1 to 2.5, the rate of increase in the S/Ag ratio may be, for example, from 0.0001/min to 1/min, preferably from 0.001/min to 0.2/min, more preferably from 0.002/min to 0.2 min, still more preferably from 0.0025/min to 0.19 min, and particularly preferably from 0.04/min to 0.12/min. If the total amount of the supply source of S is greater than 2.5 to 5.0, the rate of increase in the S/Ag ratio may be, for example, from 0.0002/min to 2/min, preferably from 0.002/min to 0.2/min, more preferably from 0.0025/min to 0.19/min, and still more preferably 0.04/min to 0.12/min.

In the addition step according to the second aspect, the supply source of S is slowly added to the mixture whose temperature has been increased to the predetermined temperature, with the predetermined temperature being maintained, in such a manner that the ratio of the number of S atoms to the total number of Ag and Cu atoms in the mixture increases at a rate of not more than 10/min. The rate of increase in the ratio of the number of S atoms to the total number of Ag and Cu atoms in the mixture (S/(Ag+Cu) ratio) is, for example, calculated by subtracting the S/(Ag+Cu) ratio at a certain point in time from the S/(Ag+Cu) ratio at the end of the unit time, and dividing the result of subtraction by the unit time in minute. The unit time may be any of, for example, between 1 sec and 1 min. The rate of increase in the ratio of the number of S atoms to the total number of Ag and Cu atoms in the mixture is preferably from 0.0001/min to 2/min, more preferably from 0.0001/min to 1/min, still more preferably from 0.001/min to 0.2/min, and particularly preferably from 0.001/min to 0.1/min for controlling the particle growth of sulfide nanoparticles that contain silver and optionally contain copper. The rate of increase is also preferably from 0.0002/min to 2/min, more preferably from 0.002/min to 0.2/min, still more preferably from 0.0025/min to 0.19/min, and particularly preferably from 0.04/min to 0.12/min. The rate of increase in S/(Ag+ Cu) ratio may be, for example, 0.0001/min or more, preferably 0.0002/min or more, 0.001/min or more, 0.002/min or more, 0.0025/min or more, 0.005/min or more, 0.01/min or more, or 0.04/min or more. The rate of increase in S/Ag ratio may be, for example, 5/min or less, preferably 2/min or less, 1/min or less, 0.5/min or less, 0.3/min or less, 0.25/min or less, 0.2/min or less, or 0.1.9/min or less.

The total amount of the supply source of S to be added according to the second aspect is such that the resulting ratio of the number of S atoms to the total number of Ag and Cu atoms in the mixture is from 0.1 to 5, and preferably from 1 to 2.5. The time required for the addition of the supply source of S is, for example, 1 min. or more, preferably 5 mm or more, more preferably 15 min or more, and still more preferably 20 mm or more. Also, the time required may be, for example, 120 min or less, preferably 60 min or less, and more preferably 40 min or less.

When the total amount of the supply source of S to be added is such that the resulting ratio of the number of S atoms to the total number of Ag and Cu atoms in the mixture is from 0.1 to 2.5, the rate of increase in the Si(Ag+Cu) ratio may be, for example, from 0.0001/min to 1/min, preferably from 0.001/min to 0.2/min, more preferably from 0.002/min to 0.2/min, still more preferably from 0.0025/min to 0.19/ min, and particularly preferably from 0.04/min to 0.12/min. When the total amount of the supply source of S to be added is such that the resulting ratio of the number of S atoms to the total number of Ag and Cu atoms in the mixture is greater than 2.5 to 5, the rate of increase in the S/(Ag+Cu) ratio may be, for example, from 0.0002/min to 2/min, preferably from 0.002/min to 0.2/min, more preferably from 0.0025/min to 0.19/min, and still more preferably 0.04/min to 0.12/min.

The source of S may be added in such a manner that the amount added per unit time is approximately the same over the required time. In other words, the amount to be added per unit time is an amount obtained by dividing the total amount to be added by the number obtained by dividing the required time by the unit time. The unit time may be, for example, 1 sec, 5 sec, 10 sec, 30 sec, or 1 min. The source of S may be added continuously or in steps. The supply source of S may be added to the mixture, for example, in an inert gas atmosphere.

Examples of the supply source of S include sulfur and sulfur-containing compounds. Specific examples of the sulfur-containing compounds include β-dithiones, such as 2,4-pentanedithione; dithiols, such as 1,2-bis(trifluoromethyl) pethylene-1,2-dithiol; dialkyl dithiocarbamates, such as diethyl dithiocarbamate; and thioureas, and alkyithioureas, such as 1,3-dialkylthiourea, 1,1-dialkylthiourea, alkylthiourea, 1,1,3-trialkylthiourea, and 1,1,3,3-tetraalkylthiourea each having an alkyl group with a carbon number of 1 to 18. As the supply source of S, sulfur-containing compounds soluble in an organic solvent are preferable, and in view of solubility and reactivity, alkyithioureas are more preferable, and 1,3-dialkylthiourea is still more preferable. As for the alkyl group of alkylthiourea, those with a carbon number of 1 to 12 are preferable, 1 to 8 are more preferable, 1 to 6 are still more preferable, 1 to 4 are even more preferable, and 1 to 3 are furthermore preferable. When alkylthiourea has a plurality of alkyl groups, they may be the same or different.

The supply source of S to be added to the mixture may take the form of a solution containing sulfur or a sulfur-containing compound dissolved in an organic solvent. The supply source of S in the form of a solution containing a sulfur-containing compound enables easy control of the amount of the supply source of S to be added per unit time in the addition step, which enables efficient production of semiconductor nanoparticles with a narrower particle size distribution.

Examples of the organic solvents for dissolving a sulfur-containing compound that serves as the source of S may be the same as the above-described organic solvents to be contained in the mixture, and, for example, amines having a hydrocarbon group with a carbon number of 4 to 20 may be used.

When the source of S is a solution containing a sulfur-containing compound, the concentration of the sulfur-containing compound may be, for example, from 1 mmol/L to 500 mmol/L, and preferably from 10 mmol/L to 50 mmol/L.

Heat Treatment Step

The method for producing semiconductor nanoparticles may further include a heat treatment step of heat-treating the mixture at a temperature in the range of from 120° C. to 300° C. after the completion of the addition of the source of S. The temperature of the heat treatment may be the same or different from the temperature to which the temperature of the mixture has been raised. The temperature of the heat treatment may be, for example, from 120° C. to 300° C., preferably from 125° C. to 175° C., more preferably from 130° C. to 160° C., and still more preferably from 135° C. to 150° C. in view of the quantum yield.

The heat treatment time may be, for example, 3 sec or more, preferably 5 min or more, 10 min or more, or 20 min or more in view of the quantum efficiency of the semiconductor nanoparticles. Although the heat treatment time has no particular upper limit, for example, it may be 60 min or less. The heat treatment time starts at the time the temperature reaches the predetermined temperature (e.g., if it is 140° C., when the temperature reaches 140° C.), and ends at the time the operation for lowering the temperature is carried out.

The atmosphere of the heat treatment may be an inert gas atmosphere, and for example, an argon atmosphere or a nitrogen atmosphere is preferable. An inert gas atmosphere may reduce or prevent generation of by-products of oxides as well as oxidation of the resulting semiconductor nanoparticles.

The method for producing semiconductor nanoparticles may include, after the synthesis step described above, a cooling step of lowering the temperature of the solution containing the semiconductor nanoparticles. The cooling step starts at the time the operation for lowering the temperature is carried out and ends at the time the solution is cooled to 50° C. or less.

The cooling step may include a period of time during which the temperature-lowering rate is 50° C./min or more in order to suppress formation of silver sulfide from unreacted Ag salt, or copper sulfide from unreacted Cu salt. The temperature-lowering rate may be, for example, 50° C./min or more at the time the temperature starts to decrease following the operation of lowering the temperature is carried out.

The atmosphere of the cooling step is preferably an inert gas atmosphere, such as an argon atmosphere or a nitrogen atmosphere. An inert gas atmosphere may reduce or prevent generation of by-products of oxides as well as oxidation of the resulting semiconductor nanoparticles.

The method for producing semiconductor nanoparticles may further include a separation step of separating the semiconductor nanoparticles from the solution, and may further include a purification step as appropriate. In the separation step, for example, a solution containing semiconductor nanoparticles may undergo centrifugation to extract the supernatant containing the semiconductor nanoparticles. In the purification step, for example, an appropriate organic solvent, such as alcohol, is added to the supernatant obtained by the separation step, which is then subjected to centrifugation to extract the semiconductor nanoparticles as precipitate. The semiconductor nanoparticles may also be extracted by vaporizing the organic solvent from the supernatant. The extracted precipitate may be dried by, for example, vacuum deairing, or natural drying, or a combination of vacuum cleaning and natural drying. Natural drying may be carried out by, for example, leaving the precipitate in atmospheric air at normal temperature and normal pressure for 20 hours or more, for example, 30 hours. The extracted precipitate may be dispersed in an appropriate organic solvent.

In the method for producing semiconductor nanoparticles, the purification step including addition of an organic solvent, such as alcohol, and centrifugation may be carried out multiple times as appropriate. As the alcohol used for purification, lower alcohols with a carbon number of from 1 to 4, such as methanol, ethanol, and n-propyl alcohol, may be used. When the precipitate is dispersed into an organic solvent, the organic solvent to be used may be a solvent containing halogen (also referred to as "a halogen-containing solvent" in this disclosure), such as chloroform, dichloromethane, dichloroethane, trichloroethane, or tetrachloroethane; or a hydrocarbon solvent, such as toluene, cyclohexane, hexane, pentane, or octane. The organic solvent for dispersing the precipitate may be a halogen-containing solvent in view of the quantum yield, The above semiconductor nanoparticles obtained by the production method according to the first aspect contain Ag, at least one of In and Ga, and S. Semiconductor nanoparticles containing Ag, In, and S, and having a tetragonal, hexagonal, or orthorhombic crystal structure are introduced in literature and others as those generally represented by the composition formula $AgInS_2$. Practically, however, such semiconductor nanoparticles may not have a stoichiometric composition represented by the above general formula, and the ratio of the number of atoms of Ag to the number of atoms of In and Ga (Ag/In Ga) may be smaller than 1, or conversely, larger than 1. In addition, the sum of the number of atoms of Ag and the total number of In and Ga atoms may not be the same as the number of S atoms. Thus, as used herein, the semiconductor composition of the semiconductor containing specific elements is represented by the elements connected with "—" like Ag—In—S in a situation whether it is a stoichiometric composition or not does not matter. Thus, the semiconductor nanoparticles may be, for example, Ag—In—S, or Ag—In—Ga—S or Ag—Ga—S where all or part of In, which is an element in Group 13, is replaced by Ga, which is another element in Group 13.

Semiconductor nanoparticles according to the third aspect obtained by the production method according to the second aspect contain Ag, Cu, at least one of In and Ga, and S. Semiconductor nanoparticles containing Ag, In, and S, and having a tetragonal, hexagonal, or orthorhombic crystal structure are introduced in literature and others as those generally represented by the composition formula $AgInS_2$. Practically, however, such semiconductor nanoparticles may not have a stoichiometric composition represented by the above general formula, and the ratio of the number of atoms of Ag to the number of atoms of In and Ga ((Ag+Cu)/(In+Ga)) may be smaller than 1, or conversely, larger than 1. In addition, the sum of the total number of Ag and Cu atoms and the total number of In and Ga atoms may not be the same as the number of S atoms. Thus, as used herein, the semiconductor composition of the semiconductor containing specific elements is represented by the elements connected with "—" like Ag—Cu—In—S in a situation whether it is a stoichiometric composition or not does not matter. Thus, the semiconductor nanoparticles may be, for example, Ag—Cu—In—S, or Ag—Cu—In—Ga—S, or Ag—Cu—Ga—S, where all or part of In, which is an element in Group 13, is replaced by Ga, which is another element in Group 13.

Semiconductor nanoparticles according to the third aspect contain Ag, Cu, at least one of In and Ga, and S, wherein the ratio of the number of Cu atoms to the total number of Ag and Cu atoms may be from 0.001 to 0.9. Upon irradiation of light having a wavelength in the range of from 350 nm to less than 500 nm, the semiconductor nanoparticles emit light with a wavelength longer than the wavelength of the light irradiated. The ratio of the number of Cu atoms to the total number of Ag and Cu atoms may be from 0.001 to 0.9, or from 0.005 to 0.5. Also, the light having a wavelength longer than the wavelength of the light irradiated may have a peak emission wavelength in the wavelength range longer than that of the light irradiated.

The semiconductor nanoparticles may have a ratio of the total number of In and Ga atoms to the total number of Ag and Cu atoms of from 0.5 to 10, from 0.8 to 5, or from 0.9 to 2. Also, the semiconductor nanoparticles may have a ratio of the number of S atoms to the total number of Ag and Cu atoms of from 1 to 10, from 1.5 to 8, or from 2 to 3.

The semiconductor nanoparticles containing the above elements and having a hexagonal crystal structure are wurtzite-type, and those having a tetragonal crystal structure are chalcopyrite-type. The crystal structure is identified by, for example, measuring the XRD pattern obtained through X-ray diffraction (MD) analysis. Specifically, the XRD pattern obtained from the semiconductor nanoparticles is compared with known XRD patterns of semiconductor nanoparticles represented by the composition $AgInS_2$ or with the XRD patterns obtained through simulations using the crystal structure parameters. If the pattern of the semiconductor nanoparticles coincides with a pattern among the known patterns and the simulated patterns, the semiconductor nanoparticles have the crystal structure of that coincided known or simulated pattern.

An aggregate of the semiconductor nanoparticles may contain semiconductor nanoparticles with different crystal structures. In that case, peaks originating from a plurality of crystal structures are observable in the XRD pattern. The core-shell semiconductor nanoparticles according to the first aspect are essentially composed of tetragonal crystal, and no peaks originating from other crystal structures are essentially observed.

Ag may be partly replaced and contain, for example, Au, but is preferably essentially composed of Ag, or Ag and Cu. As used herein "essentially" means that the ratio of elements other than Ag and Cu to Ag and Cu is, for example, 10 mol % or less, preferably 5 mol % or less, and more preferably 1 mol % or less.

Although at least one of the In and Ga may be partly replaced and contain at least one element of Al and Ti, the In and Ga are preferably essentially composed of at least one of In and Ga. As used herein "essentially" means that the ratio of elements other than In and Ga to the sum of In and Ga is, for example, 10 mol % or less, preferably 5 mol % or less, and more preferably 1 mol % or less.

S may be partly replaced and contain at least one element of Se and Te, but is preferably essentially composed of S. As used herein "essentially" means that the ratio of elements other than S to S is, for example, 10 mol % or less, preferably 5 mol % or less, and more preferably 1 mol % or less.

Semiconductor nanoparticles obtained by the production method according to the first aspect may be essentially composed of Ag, In, Ga, S, and the above-described elements partly replacing these elements. As used herein, the term "essentially" is used considering that elements originating from impurities may inevitably be contained besides Ag, In, Ga, S, and the above-described elements partly replacing these elements.

Semiconductor nanoparticles obtained by the production method according to the second aspect are essentially composed of Ag, Cu, In, Ga, S and the above-described elements partly replacing these elements. As used herein, the term "essentially" is used considering that elements originating from impurities may inevitably be contained besides Ag, Cu, In, Ga, S, and the above-described elements partly replacing these elements.

The semiconductor nanoparticles may have an average particle diameter of, for example, 10 nm or less, and particularly 8 nm or less. The average particle diameter of the semiconductor nanoparticles may be within the range of from 1.5 nm to 10 nm, and particularly within the range of from 1.7 nm to 7.5 nm. Semiconductor nanoparticles having an average particle diameter of not more than the above upper limit tend to exhibit quantum size effect.

The average particle diameter of the semiconductor nanoparticles may be determined using a TEM image captured with a transmission electron microscope (TEM), for example. Specifically, the particle diameter of semiconductor nanoparticles is defined as the length of the longest line segment among the line segments connecting any two points on the circumference of a particle and lying within the particle.

The average particle diameter of the semiconductor nanoparticles is determined by measuring the particle diameters of all the measurable particles observed in a TEM image captured with 50,000 to 150,000× magnification, and averaging the particle diameters. As used herein, "measurable" particles are particles entirely observable in a TEM image. Thus, in a TEM image, particles partially not in the captured range and observed as partially "cut" particles are not measurable. When a TEM image contains 100 or more measurable particles, their average particle diameter is obtained using the TEM image. When a TEM image contains less than 100 measurable particles, another TEM image is captured in a different site, and the average particle diameter is obtained by measuring and averaging the particle diameters of 100 or more measurable particles using the two or more TEM images.

The semiconductor nanoparticles obtained by the above-described production method may be used as cores of core-shell semiconductor nanoparticles, with shells formed on the surfaces of the cores. Core-shell semiconductor nanoparticles enable, for example, more favorable band edge emission.

The shell is a semiconductor containing at least one Group 13 element and at least one Group 16 element, and having a larger band gap energy than the semiconductor forming the core. Examples of the elements in Group 13 include B, Al, Ga, In, and Tl, and examples of the elements in Group 16 include O, S, Se, Te, and Po. The semiconductor forming the shell may contain only one, or two or more elements in Group 13, and only one, or two or more elements in Group 16.

The shell may be composed of a semiconductor that essentially consists of elements in Groups 13 and 16. As used herein "essentially" means that when the sum of the number of atoms of all elements contained in the shell is 100%, the percentage of atoms of elements other than elements in Groups 13 and 16 is, for example, 10% or less, preferably 5% or less, and more preferably 1% or less.

The shell may have a composition and others selected in accordance with the band gap energy of the semiconductor forming the core. Alternatively, when, for example, the composition and others of the shell are predetermined, the core semiconductor may be designed to have a smaller band gap energy than the shell. Typically, a semiconductor composed of Ag—In—S has a band gap energy of from 1.8 eV to 1.9 eV.

Specifically, the shell semiconductor may have a band gap energy of, for example, from 2.0 eV to 5.0 eV, and particularly from 2.5 eV to 5.0 eV. The shell band gap energy may have a larger band gap energy than the core band gap energy by about, for example, from 0.1 eV to 3.0 eV, particularly from 0.3 eV to 3.0 eV, and more particularly from 0.5 eV to 5.0 eV. When the difference in band gap energy between the shell semiconductor and the core semiconductor is not less than the lower limit, the ratio of other light emission from the core than band edge emission tends to decrease, allowing the ratio of band edge emission to increase.

In addition, the band gap energy of the core semiconductor and the band gap energy of the shell semiconductor are preferably selected to form a type-I band alignment where the core band gap energy exists between the shell band gap energy at the heterojunction of the core and the shell. Formation of the type-I band alignment enables further satisfactory band edge emission from the core. In the type-I alignment, a barrier of at least 0.1 eV is preferably formed between the core band gap and the shell band gap, and for example, a barrier of 0.2 eV or more, or 0.3 eV or more may be formed. The upper limit of the barrier is, for example, 1.8 eV or less, and particularly 1.1 eV or less. When the barrier is not less than the lower limit, the ratio of other light emission from the core than band edge emission tends to decrease, allowing the ratio of band edge emission to increase.

The shell semiconductor may contain In or Ga in Group 13. Also, the shell may contain S in Group 16. A semiconductor containing In or Ga, or S tend to have a larger band gap energy than the core.

The shell semiconductor may have a crystal system in accord with the crystal system of the core semiconductor, and may also have lattice constants equal or close to the lattice constants of the core semiconductor. A shell formed from a semiconductor with a crystal system in accord with the crystal system of the core, and lattice constants close to the core lattice constants (including its multiples close to the core lattice constants) can cover the outer circumference of the core appropriately. For example, the core described above typically have a tetragonal crystal system, and examples of the crystal system in accord with this include tetragonal and orthorhombic crystal systems. An Ag—In—S semiconductor with a tetragonal crystal system has lattice constants of 0.5828 nm, 0.5828 nm, and 1.119 nm, respectively, and the shell covering this core preferably has a tetragonal or cubic crystal system, and lattice constants or their multiples close to the lattice constants of Ag—In—S. Alternatively, the shell may be amorphous.

Whether an amorphous shell is formed may be checked by observing the core-shell semiconductor nanoparticles using a high-angle annular dark-field scanning transmission electron microscopy (HAADF-STEM). Specifically, when an amorphous shell is formed, a HAADF-STEM shows a center area with a regular pattern (e.g., stripes or dots) and its surrounding area with no regular pattern. A HAADF-STEM shows an image with a regular pattern for a substance with a regular structure like a crystal substance, and an image with no regular pattern for a substance with no regular structure like an amorphous substance. Thus, an amorphous shell may be observed as an area clearly distinct from the core shown as an image with a regular pattern (having a crystal structure such as a tetragonal crystal system as described above).

When the shell is formed from Ga—S, the shell may be shown darker than the core in the image obtained through an HAADF-STEM because Ga is a lighter element than Ag and In contained in the core.

Whether an amorphous shell is formed may also be checked by observing the core-shell semiconductor nanoparticles through a high-resolution transmission electron microscope (HRTEM). In the image obtained through an HRTFM, a crystal lattice image is observed for the core area (an image with a regular pattern), and the shell area is not observed as a crystal lattice image, but as an area of mere black and white contrast with no regular pattern.

The shell preferably does not form a solid solution with the core. If the shell forms a solid solution with the core, the two become one body and the band edge emission may not be obtained. For example, even if the surface of the core composed of Ag—In—S is covered with zinc sulfide (Zn—S) with a stoichiometric or non-stoichiometric composition, the band edge emission is proven not to be obtained from the core. Zn—S, in relation to Ag—In—S, satisfies the above conditions for band gap energy and gives a type-I band alignment. Nevertheless, the specific semiconductor failed to exhibit band edge emission because the specific semiconductor and ZnS formed a solid solution, and the core-shell interface was inferred to have been disappeared.

The shell may include, but is not limited to, a combination of In and S, a combination of Ga and S, or a combination of In and Ga and S as a combination of elements in Groups 13 and 16. The combination of In and S may take the form of indium sulfide, the combination of Ga and S may take the form of gallium sulfide, and the combination of In, Ga, and S may take the form of indium gallium sulfide. The indium sulfide thrilling the shell need not have a stoichiometric composition ($In_2S_3$), and in this sense, indium sulfide is herein represented by formula $InS_x$ (where x is not limited to integers but any number, for example, from 0.8 to 1.5). Similarly, the gallium sulfide forming the shell need not have a stoichiometric composition ($Ga_2S_3$), and in this sense, gallium sulfide is herein represented by formula $GaS_x$ (where x is not limited to integers but any number, for example, from 0.8 to 1.5). Indium gallium sulfide may have a composition $In_{2(1-y)}Ga_{2y}S_3$ (y is any number greater than 0 and less than 1), or may be represented by the composition $In_aGa_{1-a}S_b$ (a is any number greater than 0 and less than 1, and b is any number not limited to integers).

Indium sulfide has a band gap energy of from 2.0 eV to 2.4 eV, and indium sulfide with a cubic crystal system has a lattice constant of 1.0775 nm. Gallium sulfide has a band gap energy of about from 2.5 eV to 2.6 eV, and gallium sulfide with a tetragonal crystal system has a lattice constant of 0.5215 nm. However, the crystal system and others described here are all reported values, and actual core-shell semiconductor nanoparticles may not have a shell satisfying these values.

Indium sulfide and gallium sulfide are preferably used as semiconductors for forming the shell to be disposed on the surface of the core. In particular, gallium sulfide, which has a larger band gap energy, is preferably used. When gallium sulfide is used, a stronger band edge emission is obtained than when indium sulfide is used.

The core-shell semiconductor nanoparticles may have an average particle diameter of, for example, 50 nm or less. The average particle diameter is, in view of easiness of production and quantum yield of band edge emission, in the range of preferably from 1 nm to 20 nm, more preferably from 1.6 nm to 8 nm, and particularly preferably from 2 nm to 7.5 nm. The average particle diameter of the core-shell semiconductor nanoparticles is measured in the same manner as the average particle diameter of the above-described semiconductor nanoparticles.

The shell has a thickness within the range of, for example, from 0.1 nm to 50 nm, preferably within the range of from 0.1 nm to 10 nm, and more preferably within the range of from 0.3 nm to 3 nm. When the thickness of the shell is not less than the lower limit, the effect of coating the core with the shell is sufficient and band edge emission is easily obtained.

The thickness of the shell may be determined by, for example, HAADF-STEM observation of core-shell semiconductor nanoparticles. In particular, when the shell is amorphous, the shell is easily observed through HAADF-STEM as an area distinct from the core, and thus the thickness of the shell is easily obtained. If the thickness of the shell is not uniform, the smallest thickness is used as the thickness of the shell in the particle.

Alternatively, the average particle diameter of the core may be measured before coated with the shell. Then, the average thickness of the core-shell semiconductor nanoparticles is measured, and the difference between the average particle diameter and the premeasured average particle diameter of the core may be obtained to determine the thickness of the shell.

The core-shell semiconductor nanoparticles preferably have a substantially tetragonal crystal structure. The crystal structure is identified by measuring the X-ray diffraction (XRD) pattern obtained by XRD analysis as described above. Essentially tetragonal crystal means that the ratio of the peak height around 48°, which indicates hexagonal and orthorhombic crystals, to the main peak around 26°, which indicates tetragonal crystal, is 10% or less.

When irradiated with light, such as ultraviolet light, visible light, or infrared rays, the core-shell semiconductor nanoparticles emit light with a wavelength longer than the wavelength of the light irradiated. Specifically, when irradiated, for example, by ultraviolet light, visible light, or infrared rays, the semiconductor nanoparticles emit light with a wavelength longer than the wavelength of the light irradiated, an emission lifetime of the main component of 200 ns or less, and/or a spectral half bandwidth of 70 nm or less.

The core-shell semiconductor nanoparticles in which the core contains semiconductor nanoparticles containing Ag, at least one of In and Ga, and S emit light with a peak emission wavelength in the range of from 500 nm to 600 nm upon irradiation of light with a peak of around 450 nm. The spectral half bandwidth of the emission peak is, for example, 70 nm or less, 60 nm or less, 55 nm or less, or 50 nm or less. The lower limit of the half bandwidth may be, for example, 10 nm or more, or 20 nm or more. The half bandwidth may also be, for example, 250 meV or less, 210 meV or less, or 190 meV or less. The lower limit of the half bandwidth may be, for example, 35 meV or more, or 70 meV or more. For example, when the core semiconductor nanoparticles are Ag—In—Ga—S or Ag—Ga—S, when in, which is an element in Group 13, in Ag—In—S is partly or entirely replaced by Ga, which is another element in Group 13, the emission peak shifts to the shorter wavelength side.

The core-shell semiconductor nanoparticles according to the fourth aspect include a core and a shell disposed on the surface of the core, the core containing semiconductor nanoparticles containing Ag, Cu, at least one of in and Ga, and 8, wherein the ratio of the number of Cu atoms to the total number of Ag and Cu atoms is from 0.001 to 0.9, and the shell containing a semiconductor material essentially consisting of elements in Groups 13 and 16. The core-shell semiconductor nanoparticles according to the fourth aspect emit light having a peak emission wavelength in the range of from 500 nm to 820 nm when irradiated with light having a wavelength in the range of from 350 nm to less than 500 nm, for example, light with a peak of around 450 nm. The spectral half bandwidth of the emission peak is, for example, 70 nm or less, 60 nm or less, 55 nm or less, or 50 nm or less. The lower limit of the half bandwidth may be, for example, 10 nm or more, or 20 nm or more. Also, the half bandwidth may be, for example, 250 meV or less, 210 meV or less, or 190 meV or less. The lower limit of the half bandwidth may be, for example, 35 meV or more, or 70 meV or more. When the core semiconductor nanoparticles are Ag—Cu—In—Ga—S or Ag—Cu—Ga—S when in, which is an element in Group 13, in Ag—Cu—In—S is partly or entirely replaced by Ga, which is another element in Group 13, the emission peak shifts to the shorter wavelength side. As the ratio of the number of moles of Cu to the total number of moles of Ag and Cu increases, the emission peak shifts to the longer wavelength side.

The emission of the core-shell semiconductor nanoparticles may contain defect emission (e.g., donor acceptor emission) in addition to band edge emission, but preferably contains essentially band edge emission alone. A typical defect emission has a long emission lifetime and a broad spectrum with a peak at the longer wavelength side than band edge emission. As used herein, essentially band edge emission alone means that the purity of the band edge emission component is 40% or more, and preferably 60% or more. "The purity of the band edge emission component" is represented by the formula below when the peaks of the emission spectrum are separated into two: a band edge emission peak and a defect emission peak where $a_1$ denotes the area of band edge emission and $a_2$ denotes the area of defect emission (provided that the shape of each peak is assumed to be that of a normal distribution):

Purity of band edge emission component (%)=$a_1$/($a_1$+$a_2$)×100

If the emission spectrum contains no band edge emission at all, or contains only defect emission alone, the purity is 0%, if the peak areas of the band edge and the peak area of defect emission are the same, the purity is 50%, and if the emission spectrum contains band edge emission alone, the purity is 100%.

The quantum yield of the band edge emission is defined as the value obtained by multiplying the internal quantum yield, which is measured using a quantum yield measuring device with an excitation wavelength of 450 nm and a temperature of 25° C. and calculated in the range of 506 nm to 882 nm, by the purity of the hand edge emission component described above, and dividing by 100. The quantum yield of the hand edge emission of the core-shell semiconductor nanoparticles is, for example, 10% or more, and preferably 20% or more.

The peak position of the band edge emission emitted by the core-shell semiconductor nanoparticles may be changed by changing the particle size of the core-shell semiconductor nanoparticles. For example, if the particle diameter of the core-shell semiconductor nanoparticles is made smaller, the peak wavelength of the band edge emission tends to shift to shorter wavelength side. Further, if the particle diameter of the core-shell semiconductor nanoparticles is made further smaller, the spectral half bandwidth of the band edge emission tends to become further smaller.

Also, the core-shell semiconductor nanoparticles preferably exhibit an absorption spectrum or an excitation spectrum (also referred to as fluorescent excitation spectrum) with an exciton peak. An exciton peak is a peak obtained by formation of an exciton, and the appearance of this peak in the absorption or excitation spectrum means that the semiconductor nanoparticles have a small particle diameter distribution and few crystal defects, and are suitable for band-edge emission. A sharper exciton peak means that the semiconductor nanoparticles contain, in the aggregate, a greater number of particles with a uniform particle diameter and less crystal defects. Thus, the emission probably has a narrower half bandwidth and an improved emission efficiency, in the absorption or excitation spectrum of the core-shell semiconductor nanoparticles, exciton peak is observable, for example, within the range of from 350 nm to 1,000 nm. The excitation spectrum for checking the presence or absence of an exciton peak may be measured by setting the observation wavelength around the peak wavelength.

The core-shell semiconductor nanoparticles may have a shell surface modified by a surface modifier. Specific examples of the surface modifier include phosphorus-containing compounds having a negative oxidation number in addition to nitrogen-containing compounds having a hydrocarbon group with a carbon number of from 4 to 20, sulfur-containing compounds having a hydrocarbon group with a carbon number of from 4 to 20, and oxygen-containing compounds having a hydrocarbon group with a carbon number of from 4 to 20 (hereinafter also referred to as "specific modifier"). The shell surface modifier containing a specific modifier enables the core-shell semiconductor nanoparticles to exhibit a band edge' emission with an improved quantum yield.

The specific modifier contains in Group 15 with a negative oxidation number. The oxidation number of P becomes −1 when a hydrogen atom or an alkyl group binds to P, and becomes +1 when an oxygen atom binds via a single bond. The oxidation number of P varies in accordance with the substitution state of P. For example, the oxidation number of P in trialkyl phosphine and triaryl phosphine is −3, whereas it is −1 in trialkyl phosphine oxide and triaryl phosphine oxide.

The specific modifier may contain, in addition to P with a negative oxidation number, other elements in Group 15. Examples of the other elements in Group 15 include N, As, and Sb.

The specific modifier may be, for example, a phosphorus-containing compound having a hydrocarbon group with a carbon number of from 4 to 20. Examples of the hydrocarbon group with a carbon number of from 4 to 20 include linear or branched saturated aliphatic hydrocarbon groups, such as n-butyl, isobutyl, n-pentyl, n-hexyl, octyl, ethylhexyl, decyl, dodecyl, tetradecyl, hexadecyl, and octadecyl;

linear or branched unsaturated aliphatic hydrocarbon groups, such as oleyl; alicyclic hydrocarbon groups, such as cyclopentyl and cyclohexyl; aromatic hydrocarbon groups, such as phenyl and naphthyl; and arylalkyl groups, such as benzyl and naphthyl methyl. Of these, saturated aliphatic hydrocarbon groups or unsaturated aliphatic hydrocarbon groups are preferable. When the specific modifier has a plurality of hydrocarbon groups, they may be the same or different.

Specific examples of the specific modifier include tributylphosphine, triisobutylphosphine, tripentylphosphine, trihexylphosphine, trioctylphosphine, tris(ethylhexyl)phosphine, tridecylphosphine, tridodecyiphosphine, tritetradecylphosphine, trihexadecylphosphine, trioctadecylphosphine, triphenylphosphine, tributylphosphine oxide, triisobutylphosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecyl phosphine oxide, and triphenyl phosphine oxide, and at least one selected from the group consisting of these is preferable.

The surface of the shell may be modified by other surface modifiers in addition to the specific modifier. Examples of the other surface modifiers include nitrogen-containing compounds having a hydrocarbon group with a carbon number of from 4 to 20, sulfur-containing compounds having a hydrocarbon group with a carbon number of from 4 to 20, and oxygen-containing compounds having a hydrocarbon group with a carbon number of from 4 to 20. Examples of the nitrogen-containing compounds include amines and amides, examples of the sulfur-containing compounds include thiols, and examples of the oxygen-containing compounds include fatty acids.

As the other surface modifiers, nitrogen-containing compounds having a hydrocarbon group with a carbon number of from 4 to 20 and sulfur-containing compounds having a hydrocarbon group with a carbon number of from 4 to 20 are preferable. Examples of the nitrogen-containing compounds include alkylamines, such as n-butylamine, isobutylamine, n-pentylamine, n-hexylamine, octylamine, decylamine, dodecylamine, tetra-decylamine, hexadecylamine, and octadecylamine; and alkenylarnines, such as oleylamine. In particular, n-tetradecylamine is preferable because it has a boiling point of above 290° C., and is easily available with high purity. Examples of the sulfur-containing compounds include n-butanethiol, isobutanethiol, n-pentanethiol, n-hexanethiol, octanethiol, decanethiol, dodecanethiol, hexadecanethiol, and octadecanethiol.

Two or more different surface modifiers may be used in combination. For example, a single compound selected from the above examples of the nitrogen-containing compound (e.g., oleylamine) and a single compound selected from the above examples of the sulfur-containing compound (e.g., dodecanethiol) may be used in combination.

The emission of the core-shell semiconductor nanoparticles modified by a surface modifier may contain defect emission (e.g., donor acceptor emission) as well as band edge emission, but preferably essentially consists of band edge emission alone. What essentially band edge emission alone means is as described above, and the purity of the band edge emission component is preferably not less than 60%.

The measurement of the quantum yield of band edge emission of the core-shell semiconductor nanoparticles modified by the surface modifier is as described for the core-shell semiconductor nanoparticles above, and the quantum yield of the band edge emission is, for example, 30% or more, preferably 40% or more, and partially preferably 50% or more.

The core-shell semiconductor nanoparticles may be produced, for example, in the manner described below. The method for producing core-shell semiconductor nanoparticles includes a preparation step of preparing a second mixture by mixing a dispersion containing semiconductor nanoparticles obtained by the above-described method for producing semiconductor nanoparticles, a compound containing an element in Groups 13 and an element in Group 16 in the form of a single element or a compound containing an element in Group 16; and a shell-forming step of heat-treating the second mixture.

In a dispersion where the semiconductor nanoparticles are dispersed, light is not scattered, and thus the dispersion is generally transparent (colored or colorless). The solvent into which the semiconductor nanoparticles are dispersed may be any organic solvent as in the preparation of the semiconductor nanoparticles. The organic solvent may be a surface modifier or a solution containing a surface modifier. For example, the organic solvent may be a surface modifier described in relation to the method of producing the semiconductor nanoparticles, or specifically at least one selected from the nitrogen-containing compounds having a hydrocarbon group with a carbon number of from 4 to 20 (e.g., amine solvents). The organic solvent may be at least one selected from the sulfur-containing compounds having a hydrocarbon group with a carbon number of from 4 to 20 (e.g., thiol solvents). Also, the organic solvent may be a combination of at least one selected from the nitrogen-containing compounds having a hydrocarbon group with a carbon number of from 4 to 20 and at least one selected from the sulfur-containing compounds having a hydrocarbon group with a carbon number of from 4 to 20. Nitrogen-containing compounds are particularly preferable because they have a boiling point of above 290° C., which is higher than the reaction temperature, and are easily available with high purity. Specific examples of the organic solvent include oleylamine, n-tetradecylamine, dodecanethiol, and a combination of these.

The solvent for dispersing the semiconductor nanoparticles may contain a halogen-containing solvent, such as chloroform, or may be an essentially halogen-containing solvent. The dispersion of the semiconductor nanoparticles may be obtained by dispersing the semiconductor nanoparticles in a halogen-containing solvent, and then exchanging the solvent for an organic solvent containing a surface modifier such as a nitrogen-containing compound. Exchange of the solvent may be carried out by, for example, adding a surface modifier to the dispersion of the semiconductor nanoparticles, and then at least partly removing the halogen-containing solvent. Specifically, for example, a dispersion containing a halogen-containing solvent and a surface modifier is heat-treated under reduced pressure to remove the halogen-containing solvent at least partly so as to obtain a dispersion of the semiconductor nanoparticles. The conditions for the reduced pressure and the heat-treating temperature in the heat-treatment under reduced pressure are such that the halogen-containing solvent is at least partly removed and the surface modifier remains; specifically, for example, from 1 Pa to 2000 Pa, and preferably from 50 Pa to 500 Pa. The heat-treatment temperature is, for example, from 20° C. to 120° C., and preferably from 50° C. to 80° C.

The dispersion of the semiconductor nanoparticles may be prepared to have a concentration of particles in the dispersion of, for example, $5.0 \times 10^{-7}$ mol/L to $5.0 \times 10^{-5}$ mol/L, and particularly from $1.0\times10^{-6}$ mol/L to $1.0\times10^{-5}$ mol/L. When the ratio of the particles in the dispersion is too small, the poor solvent makes it difficult to collect the product through aggregation and precipitation process, and when the ratio is too large, the rate of fusion of the core materials through Ostwald ripening or collision tend to increase, resulting in a broader particle diameter distribution. The concentration of particles is based on the amount of substance as particles (number of particles).

A compound containing an element in Group 13 serves as a source of element in Group 13, and examples include organic salts, inorganic salts, or organic metal compounds of elements in Group 13. Examples of compounds containing an element in Group 13 include nitrates, acetates, sulfates, hydrochlorides, sulfonates, and acetylacetonate complexes, and preferred are organic salts such as acetates or organometallic compounds. This is because organic salts and organometallic compounds are highly soluble in organic solvents, which allows the reaction to proceed more uniformly.

An element in Group 16 in the form of a single element or a compound containing an element in Group 16 serves as a source of element in Group 16. For example, to use sulfur (S) as an element in Group 16 for a constituent element of the shell, sulfur in the form of a single element, such as high purity sulfur, may be used. Alternatively, thiols, such as n-butanethiol, isobutanethiol, n-pentanethiol, n-hexanethiol, octanethiol, decanethiol, dodecanethiol, hexadecanethiol, and octadecanethiol; disulfides, such as dibenzyl sulfide; thioureas, and alkyithioureas, such as 1,3-dimethylthioureas; and sulfur-containing compounds, such as thiocarbonyl compounds, may be used. Among them, using alkylthioureas, such as 1,3-dimethylthiourea, as a source of element in Group 16 (sulfur source) tends to produce semiconductor nanoparticles with shells sufficiently formed, enabling strong band-edge emission.

To use oxygen (O) as an element in Group 16 for a constituent element of the shell, alcohol, ether, carboxylic acid, ketone, or a N-oxide compound may be used as the source of element in Group 16. To use selenium (Se) as an element in Group 16 for a constituent element of the shell, selenium in the form of a simple element, or selenide phosphine oxide, or a compound, such as an organic selenium compound (dibenzyl diselenide or diphenyl diselenide) or a hydride of selenium may be used as the source of element in Group 16. When tellurium (Te) is used as an element in Group 16 for a constituent element of the shell, tellurium in the form of a simple element, telluride phosphine oxide, or a compound such as a hydride of tellurium may be used as a source of element in Group 16.

In the method for producing core-shell semiconductor nanoparticles, optionally, the temperature of a dispersion containing the semiconductor nanoparticles is raised to reach a peak temperature of from 200° C. to 310° C., after reaching the peak temperature, with the temperature being maintained, a mixed solution prepared in advance by dispersing or dissolving a source of element in Group 13 and a source of element in Group 16 into an organic solvent is added portion-wise, and then the temperature is lowered to form a shell layer (slow injection method). In this case, the heat treatment is started immediately after mixing the dispersion containing the semiconductor nanoparticles and the mixed solution to obtain the second mixture. The mixed solution may be added at a rate of from 0.1 mL/h to 10 mL/h, and particularly from 1 mL/h to 5 mL/h. The peak temperature may be maintained as appropriate after completion of the addition of the mixed solution.

When the peak temperature is the above-described temperature or more, the surface modifier modifying the semiconductor nanoparticles is fully removed, or a chemical reaction for forming the shell fully proceeds. Mainly for these reasons, the formation of a semiconductor layer (shell) tends to fully proceed. When the peak temperature is the above-described temperature or less, less changes occur in properties of the semiconductor nanoparticles, and a good band edge emission tends to be exhibited. The time during which the peak temperature is maintained may be from 1 min to 300 min, particularly from 10 min to 120 min in total from the start of the addition of the mixed solution. The time during which the peak temperature is maintained may be selected in relation to the peak temperature; the time for a lower peak temperature may be made longer, and the time for a higher peak temperature may be made shorter to form a good shell layer. The rate at which the temperature is raised and the rate at which the temperature is lowered are not particularly limited, and after the peak temperature is maintained for a predetermined time, the temperature may be lowered by, for example, stopping heating with a heating source (e.g., an electric heater), and letting cool.

Alternatively, in the method for producing core-shell semiconductor nanoparticles, the shell semiconductor layer may be formed on the surfaces of the semiconductor nanoparticles, by, after obtaining the second mixture by mixing the dispersion containing the semiconductor nanoparticles and the sources of elements in Groups 13 and 16, heat-treating the second mixture (heating up method). Specifically, the temperature of the second mixture is gradually raised to a peak temperature of from 200° C. to 310° C. and after the peak temperature is maintained for from 1 min to 300 min, the temperature of the second mixture is gradually lowered. The rate at which the temperature is raised may be, for example, from 1° C./min to 50° C./min, but the rate is preferably from 50° C./min to 100° C./min until the temperature reaches 200° C. to minimize changes in quality of the core without being covered by the shell under prolonged heat-treatment. When the temperature is further raised to 200° C. or more after this, the rate at which the temperature is raised is preferably from 1° C./min to 5+ C./min. The rate at which the temperature is lowered may be, for example, from 1° C./min to 50° C./min. The advantages of the predetermined peak temperature being in the above-described range are as described in the slow injection method.

The heating-up method tends to produce core-shell semiconductor nanoparticles that give stronger band edge emission than when the shell is formed by the slow injection method.

The second mixture in the heating-up method may be prepared by mixing a dispersion of semiconductor nanoparticles containing a halogen-containing solvent, an organic solvent such as a surface modifier, and sources of elements in Groups 13 and 16, and then, for example, heat-treating under reduced pressure to remove at least part of the halogen-containing solvent. In other words, the preparation step may include mixing a dispersion of semiconductor nanoparticles containing a halogen-containing solvent, an organic solvent such as a surface modifier, and sources of elements in Groups 13 and 16 to obtain a pre-mixture, and then at least partly removing the halogen-containing solvent from the pre-mixture to obtain a second mixture.

In either method, the initial ratio of the source of element in Group 16 to the source of element in Group 13 may be determined corresponding to the stoichiometric composition ratio of a compound semiconductor containing elements in Groups 13 and 16, but not necessarily corresponding to the stoichiometric composition ratio. For example, the initial ratio of the element in Group 16 to the element in Group 13 may be from 0.75 to 1.5.

Also, the initial amounts may be selected in view of the amount of the semiconductor nanoparticles contained in the dispersion to form a shell with a desired thickness on the semiconductor nanoparticles present in the dispersion. For example, the initial amounts of the sources of elements in Groups 13 and 16 may be determined to produce from 1 µmol to 10 mmol, particularly from 5 µmol to 1 mmol of a compound semiconductor containing elements in Groups 13 and 16 with a stoichiometric composition relative to 10 nmol of the semiconductor nanoparticles in terms of the amount of substance as particles; provided, however, that the amount of substance as particles is a molar amount when a single particle is regarded as a huge molecule, which is equal to a value obtained by dividing the number of nanoparticles in the dispersion by Avogadro's number ($NA=6.022 \times 10^{23}$).

In the method for producing core-shell semiconductor nanoparticles, preferably, indium or gallium acetylacetonate is used as a source of element in Group 13, sulfur in the form of a simple element, thiourea, or dibenzyldisulfide is used as a source of element in Group 16, and a mixed solution containing oleylamine and dodecanethiol or oleylamine is used as a dispersion to form a shell containing indium sulfide or gallium sulfide.

In the heating up method, when a mixed solution containing oleylamine and dodecanethiol, or oleylamine is used as a dispersion, the resulting core-shell semiconductor nanoparticles tend to show an emission spectrum with a broad peak originating from defect emission with an intensity satisfactory smaller than the peak intensity of the band edge emission. This tendency is also significantly recognized when gallium source is used as a source of element in Group 13.

The shell is thus formed to complete core-shell semiconductor nanoparticles. The resulting core-shell semiconductor nanoparticles may be separated from the solvent, and may be further purified and dried as appropriate. The separation, purification, and drying methods are as described in relation to the semiconductor nanoparticles, and thus the details will not be described.

When the core-shell semiconductor nanoparticles have their shell surfaces modified by a specific modifier, the core-shell semiconductor nanoparticles obtained above may undergo a modification step. The modification step causes the core-shell semiconductor nanoparticles and a specific modifier containing phosphorus (P) with a negative oxidation number to contact with each other to modify the shell surfaces of the core shell particles. This produces semiconductor nanoparticles that exhibit a band edge emission with a further improved quantum yield.

The core-shell semiconductor nanoparticles and the specific modifier are contacted by, for example, mixing a dispersion of the core-shell semiconductor nanoparticles and a specific modifier. Alternatively, the core shell particles may be mixed with a specific modifier in the form of a liquid. The specific modifier may be used in the form of its solution. The dispersion of the core-shell semiconductor nanoparticles is obtained by mixing the core-shell semiconductor nanoparticles with an appropriate organic solvent. Examples of the organic solvent used for dispersion include halogen-containing solvents, such as chloroform; aromatic hydrocarbon solvents, such as toluene; and aliphatic hydrocarbon solvents, such as cyclohexane, hexane, pentane, and octane. The concentration of the amount of substance of the core-shell semiconductor nanoparticles in the dispersion is, for example, from $1 \times 10^{-7}$ mol/L to $1 \times 10^{-3}$ mol/L, and preferably from $1 \times 10$ mol/L to $1 \times 10^{-4}$ mol/L.

The amount of the specific modifier to be used relative to the core-shell semiconductor nanoparticles is, for example, from 1 to 50,000 times in molar ratio. When the dispersion of the core-shell semiconductor nanoparticles has a concentration of the amount of substance of the core-shell semiconductor nanoparticles in the dispersion of from $1.0 \times 10^{-7}$ mol/L to $1.0 \times 10^{-3}$ mol/L, the dispersion and the specific modifier may be mixed in a volume ratio of from 1:1000 to 1000:1.

The temperature at which the core-shell semiconductor nanoparticles and the specific modifier are contacted is, for example, from $-100°$ C. to $100°$ C. or from $30°$ C. to $75°$ C. The duration of contact may be selected as appropriate in accordance with, for example, the amount of use of the specific modifier or the concentration of the dispersion. The duration of contact is, for example, 1 min or more, preferably 1 h or more, and also 100 h or less, and preferably 48 h or less. The atmosphere of contact is, for example, an inert gas atmosphere, such as nitrogen gas or a rare gas.

Light-Emitting Device

The light-emitting device includes a light conversion member and a semiconductor light-emitting element, wherein the light conversion member contains the above-described semiconductor nanoparticles or core—shell semiconductor nanoparticles. According to the light-emitting device, for example, emission from the semiconductor light-emitting element is partially absorbed by the semiconductor nanoparticles or core-shell semiconductor nanoparticles, and light with a longer wavelength is emitted. The light from the semiconductor nanoparticles or core-shell semiconductor nanoparticles and the residual light from the semiconductor light-emitting element are mixed, and the mixed light can be used as emission from the light-emitting device.

Specifically, using a semiconductor light-emitting element that emits bluish-violet light or blue light with a peak wavelength of from about 400 nm to about 490 nm and the semiconductor nanoparticles or core-shell semiconductor nanoparticles that absorb blue light and emit yellow light can produce a light-emitting device that emit white light. Alternatively, using two types of the semiconductor nanoparticles or core-shell semiconductor nanoparticles, specifically those that absorb blue light and emit green light and those that absorb blue light and emit red light can also produce a white light-emitting device.

Alternatively, using a semiconductor light-emitting element that emits ultraviolet rays having a peak wavelength of 400 nm or less, and three types of the semiconductor nanoparticles or core-shell semiconductor nanoparticles that absorb ultraviolet rays and emit blue light, green light, and red light, respectively, can also produce a white light-emitting device. In this case, ultraviolet rays emitted from the light-emitting element are preferably all absorbed by the semiconductor nanoparticles prevent their leakage outside.

Alternatively, using a semiconductor light-emitting element that emits blue-green light having a peak wavelength of from 490 nm to 510 nm and the semiconductor nanoparticles or core-shell semiconductor nanoparticles that absorb that blue-green light and emit red light can also produce a device that emits white light.

Alternatively, a semiconductor light emitting element that emits visible light, for example, one that emits red light with a wavelength of from 700 nm to 780 nm is used. Using the semiconductor nanoparticles or core-shell semiconductor nanoparticles that absorb visible light and emit near-infrared rays can produce a light-emitting device that emits near-infrared rays.

The semiconductor nanoparticles or core-shell semiconductor nanoparticles may be used in combination with other semiconductor quantum dots, or may be used in combination with other fluorescent materials (e.g., organic or inorganic fluorescent materials) that are not semiconductor quantum dots. The other semiconductor quantum dots are, for example, the binary semiconductor quantum dots described in the section of Description of the Related Art. Examples of the fluorescent materials that are not semiconductor quantum dots include garnet fluorescent materials such as aluminium garnet. Examples of the garnet fluorescent materials include cerium-activated yttrium·aluminium garnet fluorescent materials and cerium-activated lutetium·aluminium·garnet fluorescent materials. In addition, europium and/or chromium-activated nitrogen-containing aluminosilicate calcium fluorescent materials, europium-activated silicate fluorescent materials; nitride fluorescent materials, such as β-SiAlON fluorescent materials, CASN or SCASN-based ones; rare-earth nitride fluorescent materials, such as $LnSi_3N_{11}$ or LnSiAlON; oxynitride fluorescent materials, such as $BaSi_2O_2N_2$:Eu or $Ba_3Si_6O_{12}N_2$:Eu-based ones; sulfide-based fluorescent materials, such as CaS, $SrGa_2S_4$, $SrAl_2O_4$, and ZnS-based ones; chlorosilicate fluorescent materials; $SrLiAl_3N_4$:Eu fluorescent materials, $SrMg_3SiN_4$:Eu fluorescent materials; and manganese-activated fluoride complex fluorescent materials, such as $K_2SiF_6$:Mn fluorescent materials may be used.

In the light-emitting device, a light conversion member including the semiconductor nanoparticles or core-shell semiconductor nanoparticles may be, for example, a sheet or plate-like member, or a 3-dimensional member. An example of the 3-dimensional member is a sealing member in a surface mount light-emitting diode where a semiconductor light-emitting element is disposed on the bottom surface of a recess formed in the package, and resin is filled into the recess to form the sealing member to seal the semiconductor light-emitting element.

Another example of the light conversion member is found in the case where a semiconductor light-emitting element is disposed on a planar substrate. In this case, the light conversion member is a resin member formed in a manner to surround the top surface and the side surfaces of the semiconductor light-emitting element with a substantially uniform thickness. Still another example of the light conversion member is found in the case where a resin member containing a reflective material is filled around a semiconductor light-emitting element such that the top end of the resin member is flush with the semiconductor light-emitting element. In this case, the light conversion member is a plate-like resin member with a given thickness formed on top of the semiconductor light-emitting element and the resin member containing the reflective material.

The light conversion member may be disposed in contact with the semiconductor light-emitting element, or apart from the semiconductor light-emitting element. Specifically, the light conversion member may be a pellet member, a sheet member, a plate-like member, or a rod-like member disposed apart from the semiconductor light-emitting element, or a member disposed in contact with the semiconductor light-emitting element, for example, a sealing member, a coating member (a member separately formed from a mold member and covering the light-emitting element) or a mold member (e.g., a lens-shaped member).

When two or more types of the semiconductor nanoparticles or core-shell semiconductor nanoparticles that emit light with different wavelengths are used, the two or more types of the semiconductor nanoparticles or core-shell semiconductor nanoparticles may be mixed in a single light conversion member, or two or more light conversion members each containing a single type of the semiconductor nanoparticles or core-shell semiconductor nanoparticles may be used in combination, in this case, the two or more light conversion members may have a layered structure, or disposed in dot or stripe patterns on a plane.

An example of the semiconductor light-emitting element is an LED chip. The LED chip may include one, or two or more types of semiconductor layers selected from, for example, GaN, GaAs, InGaN, AlInGaP, GaP, SiC, and ZnO. The semiconductor light-emitting element that emits bluish-violet light, blue light, or ultraviolet rays includes a GaN compound semiconductor layer having a composition represented by, for example, $In_XAl_YGa_{1-X-Y}N$ (where 0≤X, 0≤Y, and X+Y<1).

The light-emitting device according to the present embodiment is preferably incorporated into a liquid crystal display as a light source. The semiconductor nanoparticles or core-shell semiconductor nanoparticles exhibit a band edge emission with a short emission lifetime. Thus, a light emitting device containing the semiconductor nanoparticles or core-shell semiconductor nanoparticles is suited to be used as a light source for a liquid crystal display, which requires a relatively quick response rate. Also, the semiconductor nanoparticles or core-shell semiconductor nanoparticles according to the present embodiment can exhibit a band edge emission having an emission peak with a small half bandwidth.

Thus, the light emitting devices may have the following modes:
(1) including a blue semiconductor light-emitting element that emits blue light with a peak wavelength in the range of from 420 nm to 490 nm, the semiconductor nanoparticles or core-shell semiconductor nanoparticles according to the present disclosure that emit green light with a peak wavelength in the range of from 510 nm to 550 nm, and preferably in the range of from 530 nm to 540 nm, and that emit red light with a peak wavelength in the range of from 600 nm to 680 nm, and preferably from 630 nm to 650 nm; or
(2) including a semiconductor light-emitting element that emits an ultraviolet light with a peak wavelength of 400 nm or less, the semiconductor nanoparticles or core-shell semiconductor nanoparticles that emit blue light with a peak wavelength in the range of from 430 nm to 470 nm, and preferably from 440 nm to 460 nm, that emit green light with a peak wavelength in the range of from 510 nm to 550 nm, and preferably from 530 nm to 540 nm, and that emit red light with a peak wavelength in the range of from 600 nm to 680 nm, and preferably from 630 nm to 650 nm. By using such a light emitting device, a liquid crystal display with a good color reproducibility can be obtained without using a thick-color filter. The light emitting device may be used, for example, as a direct backlight, or an edge backlight.

Alternatively, a sheet, plate, or rod-shaped resin or glass that contains the semiconductor nanoparticles or core-shell semiconductor nanoparticles may be incorporated into a liquid crystal display as a light conversion member independent of the light emitting device.

EXAMPLES

The present invention will now be described specifically with reference to Examples; however, the present invention is not limited to these Examples.

Example 1

Synthesis of Semiconductor Nanoparticles

In a reaction vessel, 0.4 mmol of silver acetate (AgOAc) and 0.4 mmol of indium acetate (In(OAc)$_3$) were mixed with 8 mL of distillation-purified oleylamine (OLA), to which dodecanethiol (1.25 mmol, 300 μL) was added to prepare a liquid A. Apart from this, 0.8 mmol of 1,3-dimethyl thiourea was dissolved in 2 mL of oleylamine to prepare a liquid B. The liquid A was degassed, replaced with an argon atmosphere, and heated to 140° C. Subsequently, the liquid B was added dropwise to the liquid A over 30 min. The ratio of the number of S atoms to the number of Ag atoms in the mixture increased at a rate of 0.067/min. After completion of the dropwise addition, the temperature was maintained at 140° C. for 30 min. This was then left to cool to room temperature and centrifuged to remove coarse particles. To the supernatant, methanol was added to precipitate semiconductor nanoparticles that serve as the core, which were collected by centrifugation. The collected solid was dispersed in 2 mL of oleylamine.

The X-ray diffraction (XRD) pattern of the obtained semiconductor nanoparticles was measured and compared with those of tetragonal (chalcopyrite) AgInS$_2$ and orthorhombic AgInS$_2$. The measured XRD pattern is shown in FIG. 1. The XRD pattern shows that the crystal structure of the obtained semiconductor nanoparticles has no peak at around 48°, which is the peak typical of orthorhombic crystal, and thus has about the same structure as that of substantially tetragonal AgInS$_2$. The XRD pattern was measured using a powder X-ray diffraction system (trade name: SmartLab) manufactured by Rigaku.

The shape of the obtained semiconductor nanoparticles was observed using a transmission electron microscope (TEM manufactured by Hitachi High-Technologies, trade name: H-7650), and the average particle diameter was measured using 80,000× to 200,000×TEM images. The TEM grid used was a high-resolution carbon HRC-C10 STEM Cu100P grid (Oken Shoji). The shape of the obtained particles is seemingly spherical or polygonal. The average particle diameter was calculated by selecting TEM images of three or more sites and measuring and averaging all the measurable nanoparticles in these images. In other words, the particle diameters of all the particles excluding particles cut off at the edges of the images were measured and their arithmetic average was obtained. In both the examples and the later described comparative examples, the particle diameters of 100 or more nanoparticles in total were measured using three or more TEM images. The average particle diameter of the semiconductor nanoparticles was 4.68 nm with a standard deviation of 0.36 nm.

Subsequently, the amount of substance of indium contained in the obtained semiconductor nanoparticles was determined by ICP emission spectroscopy (Shimadzu, ICPS-7510) measurement, and was found to be 43.5 μmol. When the average particle diameter is 4.68 nm, the volume of the semiconductor nanoparticles when spherical is calculated to be 53.67 nm$^3$. The unit lattice volume of silver indium sulfide crystals when tetragonal is calculated to be 0.38 nm$^3$ (lattice constants 0.528 nm, 0.5828 nm, and 1.119 nm), and thus, by dividing the volume of the semiconductor nanoparticles by the unit lattice volume, 141 unit lattices were calculated to be contained per semiconductor nanoparticle. Next, since four indium atoms are contained in a single unit lattice of silver indium sulfide crystals when tetragonal, 564 indium atoms were calculated to be contained per nanoparticle. By dividing the amount of substance of indium by the number of indium atoms per nanoparticle, the amount of substance per nanoparticle of the semiconductor nanoparticles was calculated to be 77.1 nmol.

Synthesis of Core-Shell Semiconductor Nanoparticles 0.1 mmol of gallium acetylacetonate (Ga(acac)$_3$) and 0.1 mmol of 1,3-dimethylthiourea were measured and added to 8 mL of distillation-purified oleylamine. The oleylamine dispersion of the semiconductor nanoparticles synthesized above was then added as the dispersion of core particles at a nanoparticle concentration equivalent to 30 nmol. The resultant solution was degassed at about 60° C. and replaced with an argon atmosphere, and then the temperature was rapidly raised until reaching 230° C. (at a temperature-raising rate of about 60° C./min), and after 230° C., the temperature was further raised to 280° C. at a rate of 2° C./min, and heat-treated at 280° C., for 30 min. This was then left to cool to room temperature, and methanol was added to precipitate core-shell semiconductor particles, and after washing, the resultant core-shell semiconductor nanoparticles were dispersed in chloroform.

Modification Step

A portion of the obtained chloroform dispersion of core-shell semiconductor nanoparticles was separated, and its equal amount of trioctylphosphine (TOP) was added and mixed, which was left standing at room temperature for 24 h to obtain a dispersion of TOP-modified core-shell semiconductor nanoparticles.

Measurement of Absorption and Emission Spectra, and Quantum Yield

Figure 2:
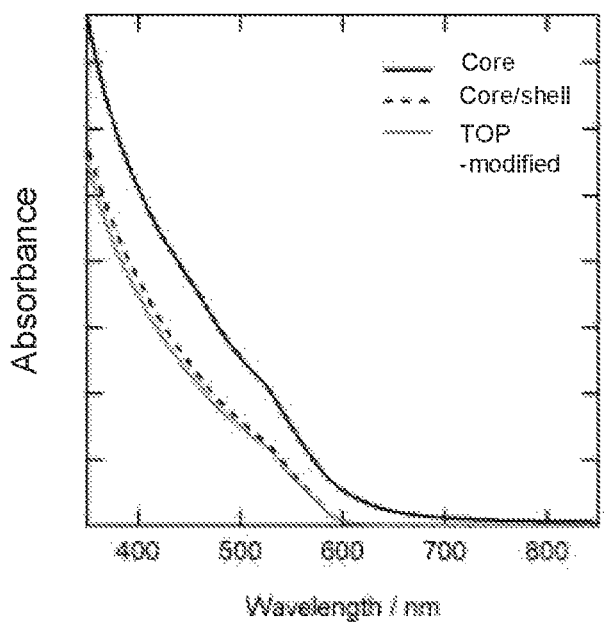
FIG. 2 shows exemplary absorption spectra of core-shell semiconductor nanoparticles according to Example 1.
Figure 3:
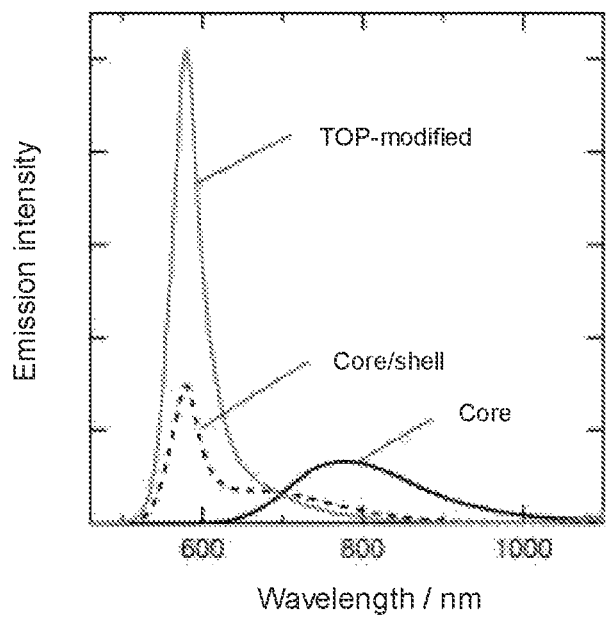
FIG. 3 shows exemplary emission spectra of semiconductor nanoparticles according to Example 1.

The absorption and emission spectra of the semiconductor nanoparticles, core-shell semiconductor nanoparticles, and TOP-modified core-shell semiconductor nanoparticles were measured. The results are shown in FIGS. 2 and 3. The absorption spectra were measured using a UV-Vis-NIR spectrophotometer (JASCO, trade name: V-670) in a wavelength range of from 350 nm to 850 nm. The emission spectra were measured using a multi-channel photo detector (Hamamatsu Photonics, trade name: PMA12) with an excitation wavelength of 450 nm. The quantum yield was measured at room temperature (25° C.) using a fluorescent spectrum measuring device PMA-12 (Hamamatsu Photonics) equipped with an integrating sphere in the wavelength range of from 350 nm to 1100 nm and calculated in the wavelength range of from 506 nm to 882 nm.

As shown in FIG. 2, a slight shoulder is observed at around 500 nm and there is substantially no absorption around 600 nm and beyond in the absorption spectrum of the core-shell semiconductor nanoparticles, suggesting that there is an exciton peak at around from 400 nm to 600 nm. In addition, as shown in FIG. 3, a band edge emission with a half bandwidth of about 42 nm is observed at around 579 nm, wherein the quantum yield of the band edge emission was 10.3%, and the purity of the band edge emission component was 42.7%. In the emission spectrum of the TOP-modified core-shell semiconductor nanoparticles, the band edge emission with a half bandwidth of about 40 nm was observed at around 579 nm, wherein the quantum yield of the band edge emission was 37.4%, and the purity of the band edge emission component was 62.3%.

Comparative Example 1

Synthesis of Semiconductor Nanoparticles

In a reaction vessel, 0.4 mmol of silver acetate (AgOAc) and 0.4 mmol of indium acetate (In(OAc)$_3$) were mixed with 8 mL of distillation-purified oleylamine (OLA), to which dodecanethiol (1.25 mmol, 300 µL) was added with stirring. The synthesis solution was degassed and replaced with an argon atmosphere, and the temperature was raised to about 70° C. Once the lid was opened, and thiourea crystals (0.8 mmol, 60.8 mg) were added all at once within 10 sec. The ratio of the number of Ag atoms to the number of S atoms in the mixture increased at a rate of 12/min or more. The mixture was then degassed for a very short time and then the temperature was raised until reaching 130° C. at a temperature-raising rate of 30° C./min After reaching 130° C. in actual measurement, heat treatment was continued for 600 sec. Subsequently, the reaction vessel was quenched by being immersed in water at room temperature to halt the synthesis. During the quench, the temperature was lowered at an average rate of about 50° C./min. After removing coarse particles by centrifugation, methanol was added to the supernatant to precipitate semiconductor nanoparticles that serve as the core, which were then collected by centrifugation. The collected solid was dispersed in 2 of oleylamine.

Figure 4:
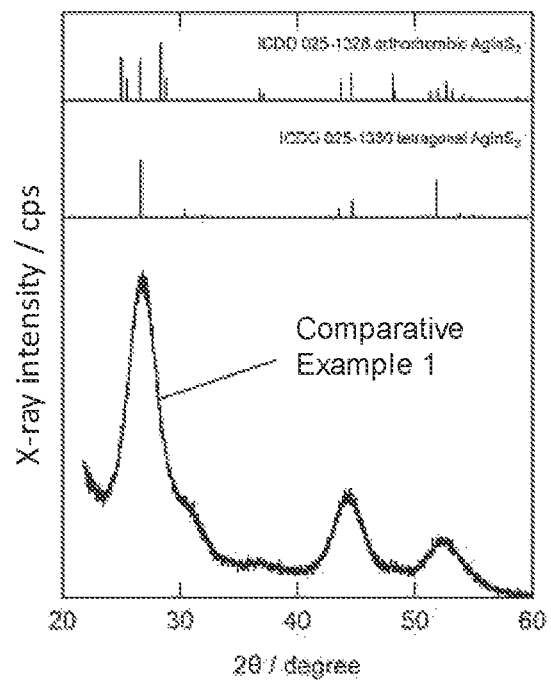
FIG. 4 shows an exemplary XRD pattern of semiconductor nanoparticles according to Comparative Example 1.

For the obtained semiconductor nanoparticles, the XRD pattern was measured and compared with those of tetragonal (chalcopyrite) AgInS$_2$ and orthorhombic AgInS$_2$. The measured XRD pattern is shown in FIG. 4. The XRD pattern shows that the crystal structure of the semiconductor nanoparticles is about the same as that of substantially tetragonal AgInS$_2$ as in the Example (FIG. 1), but in comparison with the Example, a slight peak was observed at around 48°, or the peak typical of orthorhombic crystal.

The obtained semiconductor nanoparticles were also observed using a transmission electron microscope as in the Example. The shape of the obtained particles was seemingly spherical or polygonal as those of the Example, and the particles were found to have an average particle diameter of 4.17 nm with a standard deviation of 0.45 nm.

The amount of substance of indium in the obtained semiconductor nanoparticles was determined by ICP emission spectroscopy measurement in the same manner as in the Example, and was found to be 41.5 µmol. Based on the above average particle diameter: 4.17 nm, the amount of substance as semiconductor nanoparticles was calculated to be 104 nmol.

Synthesis of Core-Shell Semiconductor Nanoparticles 0.1 mmol of gallium acetylacetonate (Ga(acac)$_3$) and 0.1 mmol of 1,3-dimethylthiourea were measured and added to 8 mL of distillation-purified oleylamine. Then, 0.5 mL of the oleylamine dispersion of the semiconductor nanoparticles synthesized above was added as the core particle dispersion (the amount of substance, or the number of particles as nanoparticles, of 30 mmol). The resultant solution was degassed at about 60° C., and then the temperature was raised at a temperature-raising rate of 60° C./min until reaching 230° C. After 230° C., the temperature was raised to 280° C. at a rate of 2° C./min, and the solution was heat-treated at 280° C. for 30 min. Subsequently, the temperature was lowered to 150° C. under room temperature, and vacuuming was carried out once to remove volatile components such as hydrogen sulfide, and then when lowered to 100° C. or less, the flask was immersed in water and quenched to room temperature. Methanol was added to precipitate core-shell particles, and after washing, the resultant core-shell semiconductor nanoparticles were dispersed in chloroform (4 mL).

Modification Step

A portion of the chloroform dispersion of the obtained core-shell semiconductor nanoparticles was separated to obtain a dispersion of the semiconductor nanoparticles or core-shell particles TOP-modified in the same manner as in the Example.

Measurement of Absorption and Emission Spectra, and Quantum Yield

Figure 5:
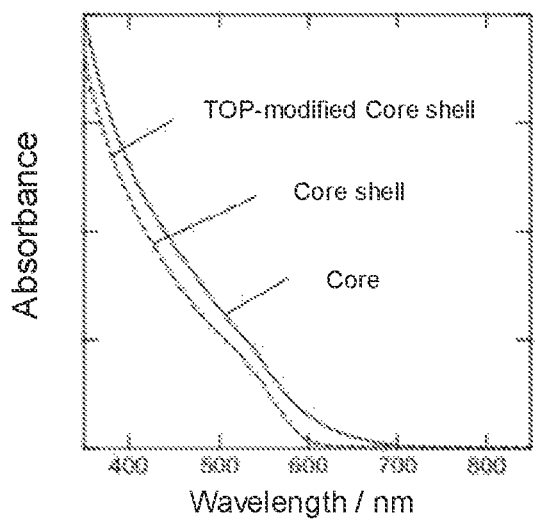
FIG. 5 shows exemplary absorption spectra of semiconductor nanoparticles according to Comparative Example 1.
Figure 6:
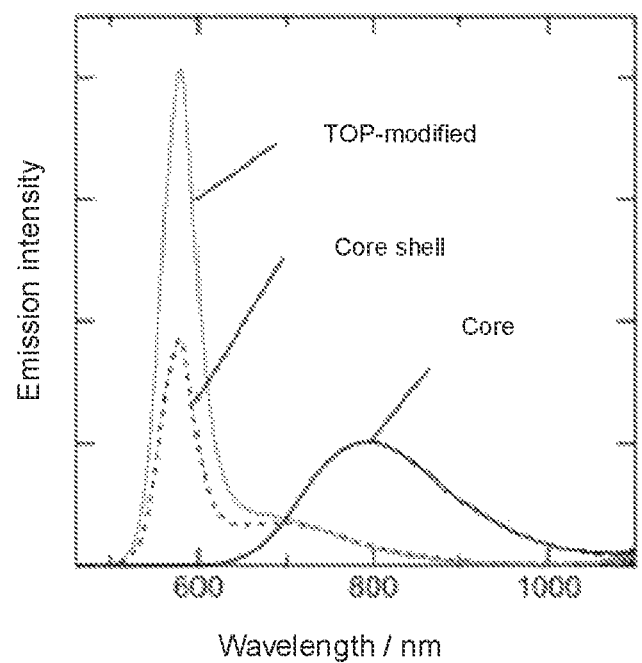
FIG. 6 shows exemplary emission spectra of semiconductor nanoparticles according to Comparative Example 1.
Figure 7:
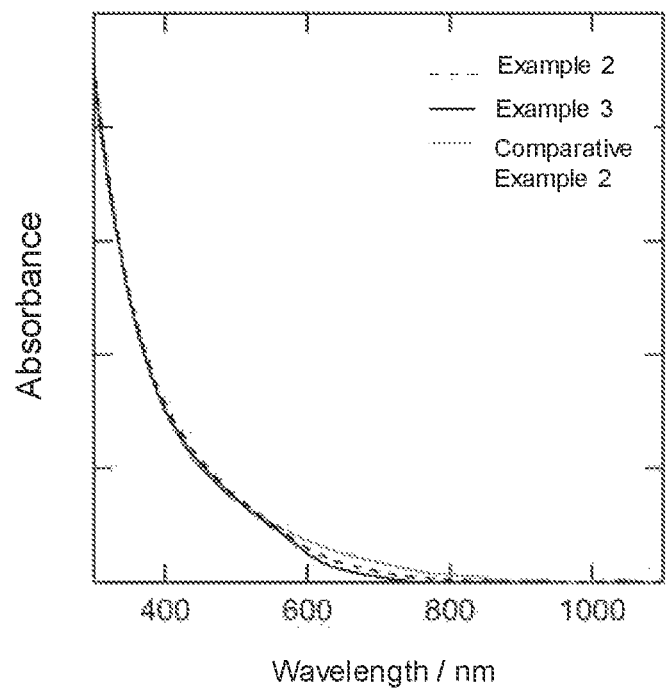
FIG. 7 shows exemplary absorption spectra of semiconductor nanoparticles according to Examples 2 and 3 and Comparative Example 2.
Figure 8:
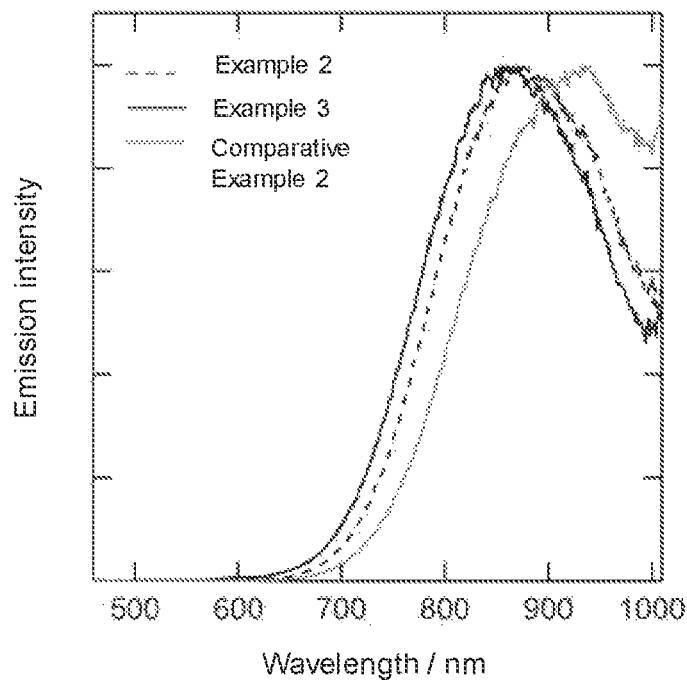
FIG. 8 shows exemplary emission spectra of semiconductor nanoparticles according to Examples 2 and 3 and Comparative Example 2.
Figure 9:
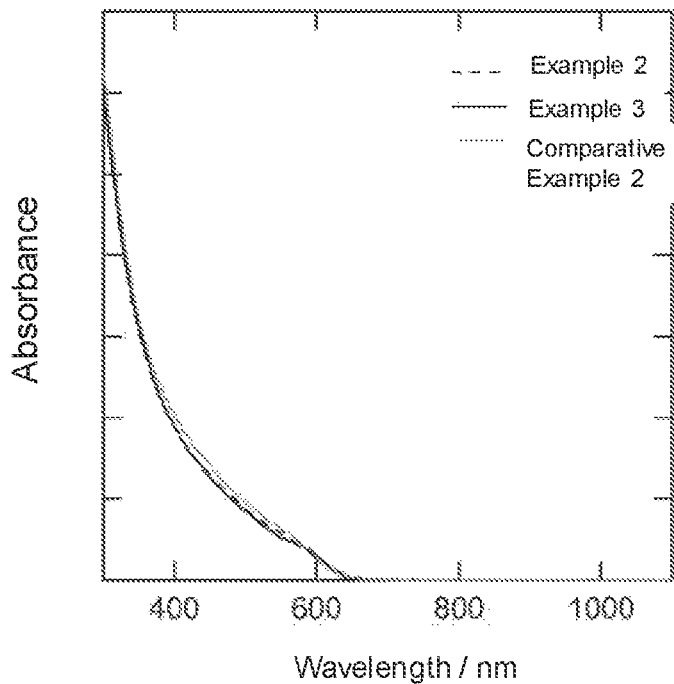
FIG. 9 shows exemplary absorption spectra of core-shell semiconductor nanoparticles according to Examples 2 and 3 and Comparative Example 2.
Figure 10:
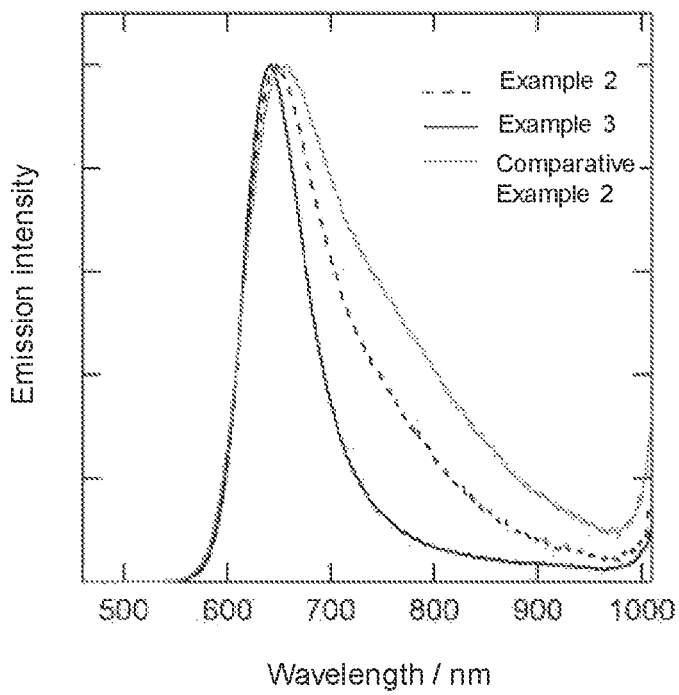
FIG. 10 shows exemplary emission spectra of core-shell semiconductor nanoparticles according to Examples 2 and 3 and Comparative Example 2.

The absorption and emission spectra of the semiconductor nanoparticles, core-shell semiconductor nanoparticles, and TOP-modified core-shell semiconductor nanoparticles were measured in the same manner as in the Example. The results are shown in FIGS. 5 and 6. As shown in FIG. 5, a slight shoulder is observed at around 500 nm and there is substantially no absorption around 600 nm and beyond in the absorption spectrum of the core-shell semiconductor nanoparticles, suggesting that there is an exciton peak at around from 400 nm to 600 nm. In addition, as shown in FIG. 6, in the emission spectrum of the core-shell semiconductor nanoparticles, a band edge emission with a half bandwidth of about 44 nm was observed at around 577 nm, wherein the quantum yield of the band edge emission was 12.3%, and the purity of the band edge emission component was 44.4%. In the emission spectrum of the TOP-modified core-shell semiconductor nanoparticles, a band edge emission with a half bandwidth of about 46 nm was observed at around 579 nm, wherein the quantum yield of the band edge emission was 31.7%, and the purity of the band edge emission component was 67.1%.

Example 2

Synthesis of Semiconductor Nanoparticles

In a reaction vessel, 0.39 mmol of silver acetate (AgOAc), 0.01 mmol of copper acetate (II) (Cu(OAc)$_2$), and 0.4 mmol of indium acetate (In(OAc)$_3$) were mixed with 8 mL of distillation-purified oleylamine (OLA), to which dodecanethiol (1.25 mmol, 300 µL) was added to prepare a liquid A. Apart from this, 0.8 mmol of 1,3-dimethylthiourea was dissolved in 2 mL of oleylamine to prepare a liquid B. The liquid A was degassed, replaced with an argon atmosphere, and heated to 140° C. Subsequently, the liquid B was added dropwise to the liquid A over 30 min. The ratio of the number of S atoms to the total number of Ag and Cu atoms in the mixture increased at a rate of 0.067/min. After completion of the dropwise addition, the temperature was maintained at 140° C. for 30 min. This was then quenched to 50° C. After removing coarse particles by centrifugation, methanol was added to the supernatant to precipitate semiconductor nanoparticles that serve as the core, Which were collected by centrifugation. The collected solid was dispersed in 3 mL of oleylamine.

Synthesis of Core-Shell Semiconductor Nanoparticles 0.1 mmol of gallium acetylacetonate (Ga(acac)$_3$) and 0.1 mmol of 1,3-dimethylthiourea were measured and added to 7 mL of distillation-purified oleylamine. The oleylamine dispersion of the semiconductor nanoparticles synthesized above was then added as the dispersion of core particles at a nanoparticle concentration equivalent to 30 nmol. The resultant solution was degassed at about 80° C. and replaced with an argon atmosphere, and then the temperature was rapidly raised until reaching 230 CC (at a temperature-raising rate of about 60° C./min), and after 230° C., the temperature was further raised to 280° C. at a rate of 2° C./min, and heat-treated at 280° C. for 1 min. Subsequently, this was quenched to 50° C., and methanol was added to precipitate core-shell semiconductor particles, which were centrifuged, and the resultant core-shell semiconductor nanoparticles were then dispersed in chloroform.

Example 3

Synthesis of Semiconductor Nanoparticles and Core-Shell Semiconductor Nanoparticles Semiconductor nanoparticles and core-shell semiconductor nanoparticles were obtained in the same manner as in Example 2 except that 1,3-dibutylthiourea was used in place of thiourea in the liquid B.

The average particle diameter, absorption and emission spectra of the respective semiconductor nanoparticles and core-shell semiconductor nanoparticles obtained in Examples 2 and 3 and Comparative Example 2 were measured in the same manner as in Example 1. The results are shown in Table 1 and FIGS. 7 to 10. The absorption spectra were measured using a UV-Vis-NIR spectrophotometer (JASCO, trade name: V-670) in the wavelength range of from 350 nm to 850 nm. The emission spectra were measured using a spectrofluorometer (JASCO, trade name: FP-8600) with an excitation wavelength of 450 nm. The quantum yields were measured using a fluorescent spectrum measuring device PMA-12 (Hamamatsu Photonics) equipped with an integrating sphere at room temperature (25° C.) at an excitation wavelength of 450 nm in the wavelength range of from 350 nm to 1100 nm and calculated in the wavelength range of from 550 nm to 1100 nm.

TABLE 1

| | Semiconductor nanoparticles | | | Core-shell semiconductor nanoparticles | | |
|---|---|---|---|---|---|---|
| | | | | Band-edge | | |
| | Average particle diameter (nm) | Standard deviation (nm) | Peak emission wavelength (nm) | emission peak wavelength (nm) | Band-edge emission quantum yield (%) | Band-edge emission half-wavelength (meV) |
| Example 2 | 4.85 | 0.50 | 877 | 648 | 54 | 181 |
| Example 3 | 3.75 | 0.53 | 863 | 641 | 55 | 168 |
| Comparative Example 2 | 4.98 | 0.85 | 932 | 658 | 32 | 217 |

Comparative Example 2

Synthesis of Semiconductor Nanoparticles

In a reaction vessel, 0.39 mmol of silver acetate (AgOAc), 0.01 mmol of copper acetate (Cu(OAc)$_2$), and 0.4 mmol of indium acetate (In(OAc)$_3$) were mixed with 8 mL of distillation-purified oleylamine (OLA), to which dodecanethiol (1.25 mmol, 300 µL) was added with stirring. The synthesis solution was degassed and replaced with an argon atmosphere, and the temperature was raised to about 70° C. Once the lid of the reaction vessel was opened, and thiourea crystals (0.8 mmol, 60.8 mg) were added all at once within 10 sec to obtain a mixture (the rate of increase in the ratio of the number of S atoms to the number of Ag atoms in the mixture was 12/min. or more). Subsequently, the mixture was degassed for a short time and then the temperature was raised to 130° C. at a temperature-raising rate of 30° C./min After reaching 140° C. in actual measurement, the heat treatment was continued for 600 sec. The reaction vessel was then quenched by being immersed in water at room temperature. During the quench, the temperature was lowered at a temperature-lowering rate of about 50° C./min. After removing coarse particles by centrifugation, methanol was added to the supernatant to precipitate semiconductor nanoparticles, which were then collected by centrifugation. The collected solid was dispersed in 3 mL of oleylamine.
Synthesis of Core-Shell Semiconductor Nanoparticles Core shell semiconductor nanoparticles were obtained in the same manner as in Example 2 except that the semiconductor nanoparticles obtained above were used.

Example 4

Synthesis of Semiconductor Nanoparticles

In a reaction vessel, 0.4 mmol of silver acetate (AgOAc) and 0.4 mmol of indium acetate (In(OAc)$_3$) were mixed with 8 mL of distillation-purified oleylamine (OLA), to which dodecanethiol (1.25 mmol, 300 µL) was added to prepare a liquid A. Apart from this, 0.8 mmol of 1,3-dimethylthiourea was dissolved in 2 mL of oleylamine to prepare a liquid B. The liquid A was degassed, replaced with an argon atmosphere, and heated to 140° C. Subsequently, the liquid B was added dropwise to the liquid A over 30 min. The ratio of the number of S atoms to the number of Ag atoms (S/Ag ratio) in the mixture increased at a rate of 0.067/min. After completion of the dropwise addition, the liquid temperature was maintained at 140° C. for 30 min. This was then left to cool to room temperature, and centrifuged to remove coarse particles. After this, methanol was added to the supernatant to precipitate semiconductor nanoparticles that serve as the core, which were collected by centrifugation. The collected solid was dispersed in 2 mL of oleylamine.

Figure 11:
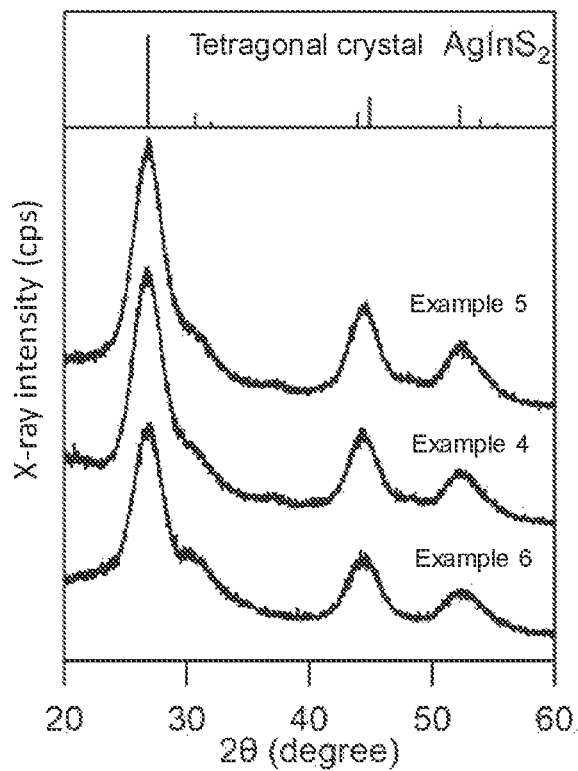
FIG. 11 shows exemplary X-ray diffraction (XRD) patterns of semiconductor nanoparticles according to Examples 4, 5, and 6.

For the obtained semiconductor nanoparticles, the XRD pattern was measured in the same manner as in Example 1. The measured XRD is shown in FIG. 11. The crystal structure of the obtained semiconductor nanoparticles has no peak at around 48°, or the peak typical of orthorhombic crystal, demonstrating that the structure is about the same as that of substantially tetragonal AgInS$_2$.

The obtained semiconductor nanoparticles were observed using a transmission electron microscope in the same manner as in Example 1. The shape of the obtained particles is seemingly spherical or polygonal as those of the Example. The results of the average particle diameter and standard deviation of the semiconductor nanoparticles are shown in Table 2.

The amount of substance of indium contained in the obtained semiconductor nanoparticles was determined by ICP emission spectroscopy in the same manner as in Example 1, and was calculated to be 100 nmol.

Synthesis of Core-Shell Semiconductor Nanoparticles 0.1 mmol of gallium acetylacetonate (Ga(acac)$_3$) and 0.1 mmol of 1,3-dimethylthiourea were measured and added to 8 mL of distillation-purified oleylamine. The oleylamine dispersion of the semiconductor nanoparticles synthesized above was then added as the dispersion of core particles at a nanoparticle concentration equivalent to 30 nmol. The resultant solution was degassed at about 60° C. and replaced with an argon atmosphere, and then the temperature was rapidly raised until reaching 230° C. (at a temperature-raising rate of about 60° C./min), and after 230° C., the temperature was further raised to 280° C. at a rate of 2° C./min, and heat-treated at 280° C. for 30 min. This was then left to cool to room temperature, and methanol was added to precipitate core-shell semiconductor particles, and after washing, the resultant core-shell semiconductor nanoparticles were dispersed in chloroform.

Modification Step

A portion of the obtained chloroform dispersion of the core-shell semiconductor nanoparticles was used to obtain a dispersion of TOP-modified core-shell semiconductor nanoparticles in the same manner as in Example 1.

Measurement of Absorption and Emission Spectra, and Quantum Yield

Figure 12:
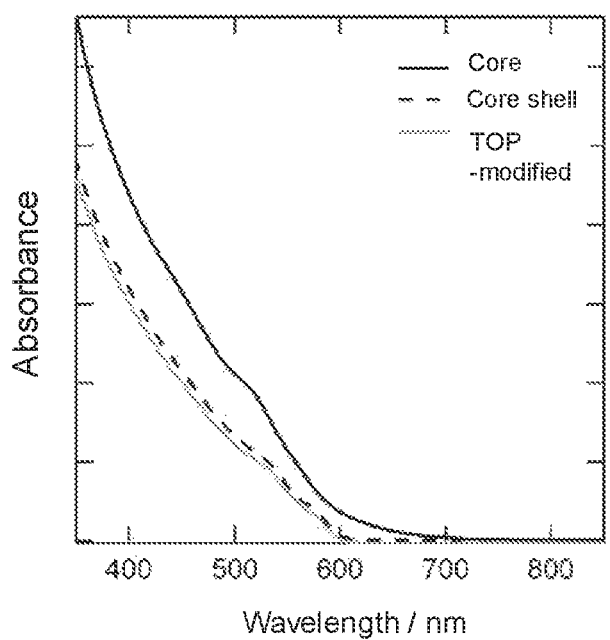
FIG. 12 shows exemplary absorption spectra of semiconductor nanoparticles according to Example 4.
Figure 13:
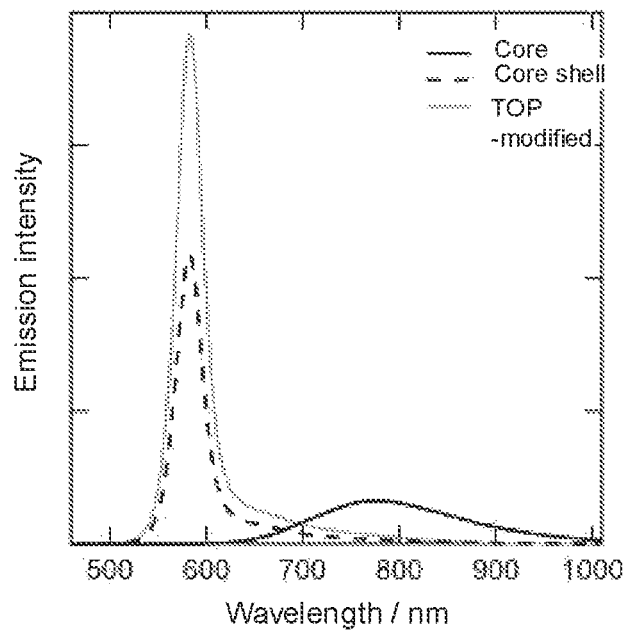
FIG. 13 shows exemplary emission spectra of semiconductor nanoparticles according to Example 4.

The results measured in the same manner as in Example 1 are shown in Table 2. The absorption spectra are shown in FIG. 12, and the emission spectra are shown in FIG. 13.

Example 5

Synthesis of Semiconductor Nanoparticles

Semiconductor nanoparticles were prepared in the same manner as in Example 4 except that the duration of dropwise addition of the liquid B was changed from 30 min to 60 min. The nanoparticles were then dispersed in 2 mL of chloroform.

For the obtained semiconductor nanoparticles, the XRD pattern was measured in the same manner as in Example 1. The measured XRD is shown in FIG. 11. The crystal structure of the obtained semiconductor nanoparticles has no peak at around 48°, or the peak typical of orthorhombic crystal, demonstrating that the structure is about the same as that of substantially tetragonal AgInS$_2$.

The obtained semiconductor nanoparticles were observed using a transmission electron microscope in the same manner as in Example 1. The shape of the obtained particles is seemingly spherical or polygonal as those of the Example. The results of the average particle diameter and standard deviation of the semiconductor nanoparticles are shown in Table 2.

Synthesis of Core-Shell Semiconductor

By using the chloroform dispersion of the obtained core-shell semiconductor nanoparticles, core-shell semiconductor nanoparticles were prepared in the same manner as in Example 4.

Modification Step

By using a portion of the chloroform dispersion of the obtained core-shell semiconductor nanoparticles, a dispersion of TOP-modified core-shell semiconductor nanoparticles was obtained in the same manner as in Example 1.

Measurement of Absorption and Emission Spectra, and Quantum Yield

Figure 14:
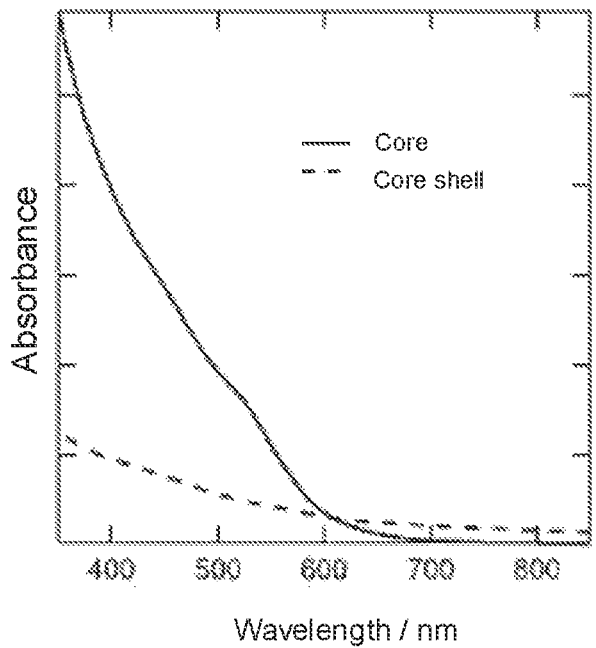
FIG. 14 shows exemplary absorption spectra of semiconductor nanoparticles according to Example 5.
Figure 15:
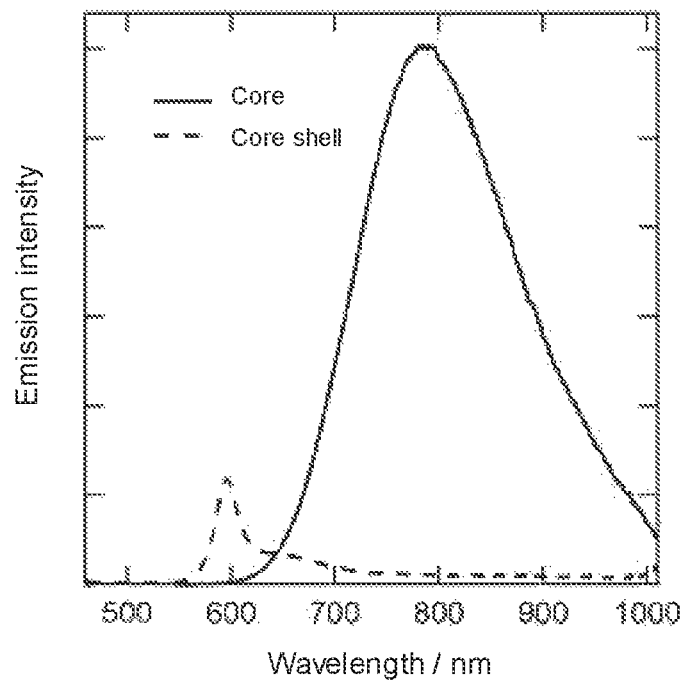
FIG. 15 shows exemplary emission spectra of semiconductor nanoparticles according to Example 5.

The results measured in the same manner as in Example 1 are shown in Table 1. The absorption spectra are shown in FIG. 14, and the emission spectra are shown in FIG. 15.

Example 6

Synthesis of Semiconductor Nanoparticles

Semiconductor nanoparticles that serve as the core were prepared in the same manner as in Example 4 except that the duration of dropwise addition of the liquid B was changed from 30 min to 15 min, and were dispersed in 2 mL of chloroform.

For the obtained semiconductor nanoparticles, the XRD pattern was measured in the same manner as in Example 1. The measured XRD is shown in FIG. 11. The crystal structure of the obtained semiconductor nanoparticles has no peak at around 48°, or the peak typical of orthorhombic crystal, demonstrating that the structure is about the same as that of substantially tetragonal AgInS$_2$.

The obtained semiconductor nanoparticles were observed using a transmission electron microscope in the same manner as in Example 1. The shape of the obtained particles is seemingly spherical or polygonal as those of the Example. The results of the average particle diameter and standard deviation of the semiconductor nanoparticles are shown in Table 2.

Synthesis of Core-Shell Semiconductor Nanoparticles

By using the chloroform dispersion of the obtained semiconductor nanoparticies, core-shell semiconductor nanoparticles were prepared in the same manner as in Example 4.

Modification Step

By using a portion of the chloroform dispersion of the obtained core-shell semiconductor nanoparticles, a dispersion of core-shell semiconductor nanoparticles TOP-modified in the same manner as in Example 1 was obtained.

Measurement of Absorption and Emission Spectra, and Quantum Yield

Figure 16:
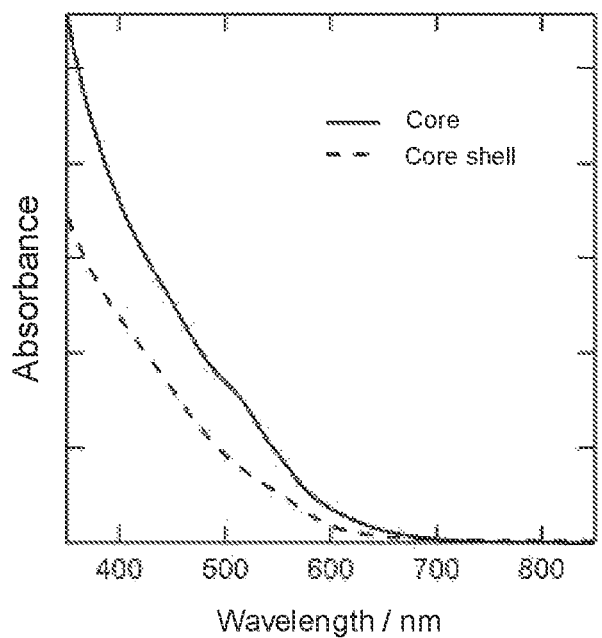
FIG. 16 shows exemplary absorption spectra of semiconductor nanoparticles according to Example 6.
Figure 17:
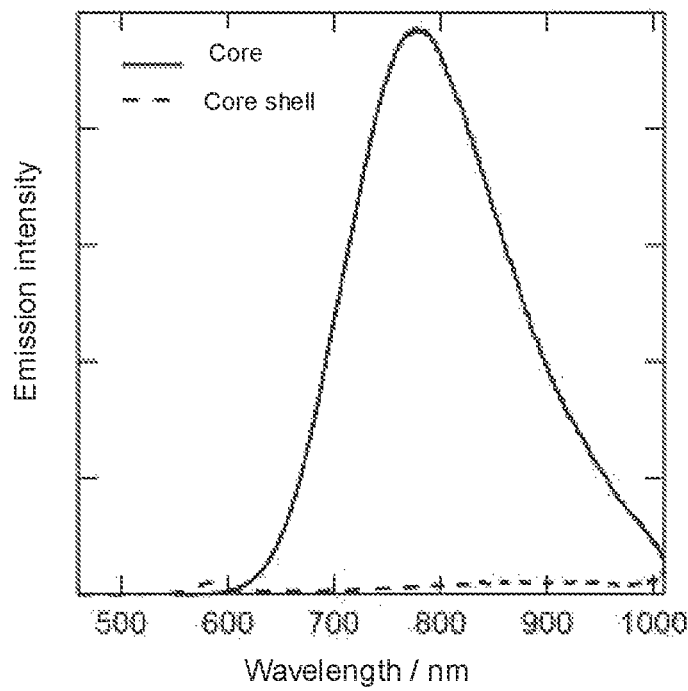
FIG. 17 shows exemplary emission spectra of semiconductor nanoparticles according to Example 6.

Table 1 shows the results measured in the same manner as in Example 1. The absorption spectra are shown in FIG. 16, and the emission spectra are shown in FIG. 17.

TABLE 2

| | Duration of dropwise addition of Liquid B (min) | Increase rate of S (ratio/min) | Semiconductor nanoparticles | | Core-shell semiconductor nanoparticles | | | | TOP treatment | |
|---|---|---|---|---|---|---|---|---|---|---|
| | | | Average diameter (nm) | Standard deviation (nm) | Peak wavelength (nm) | Half-width (nm) | Quantum Yield (%) | Purity (%) | Quantum Yield (%) | Purity (%) |
| Example 4 | 30 | 0.067 | 3.1 | 0.30 | 582 | 32 | 52 | 73 | 72 | 76 |
| Example 5 | 60 | 0.033 | 3.9 | 0.40 | 596 | 26 | 6 | 49 | — | — |
| Example 6 | 15 | 0.133 | 3.9 | 0.40 | 584 | 31 | 2 | 8 | — | — |

Table 2 shows that among the band edge emissions of the core-shell semiconductor nanoparticles of Examples 4, 5 and 6 with different increase rates of S/Ag ratio (duration of dropwise addition of the liquid B), the core-shell semiconductor nanoparticles of Example 4 with an increase rate of S/Ag ratio of 0.067/min (duration of dropwise addition of the liquid B of 30 min) have the highest quantum yield of band edge emission.

Example 7

Synthesis of Semiconductor Nanoparticles

In a reaction vessel, 0.4 mmol of silver acetate (AgOAc), 0.24 mmol indium acetate (In(OAc)$_3$), and 0.36 mmol of gallium acetylacetonate (Ga(acac)$_3$) were mixed with 8 mL of distillation-purified oleylamine (OLA), to which dodecanethiol (3.47 mmol, 833 µL) was added to prepare a liquid A. Apart from this, 1.2 mmol of 1,3-dimethylthiourea was dissolved in 2 mL of oleylamine to prepare a liquid B. The liquid A was degassed, replaced with a nitrogen atmosphere, and heated to 180° C. Subsequently, the liquid B was added dropwise to the liquid A over 30 min. The ratio of the number of S atoms to the number of Ag atoms (S/Ag ratio) in the mixture increased at a rate of 0.100/min. After completion of the dropwise addition, the liquid temperature was maintained at 180° C. for 30 min. This was then left to cool to room temperature, and centrifuged to remove coarse particles. After this, methanol was added to the supernatant to precipitate semiconductor nanoparticles that serve as the core, which were collected by centrifugation. The collected solid was dispersed in 5 mL of hexane.

Synthesis of Core-Shell Semiconductor Nanoparticles 0.1 mmol of gallium acetylacetonate (Ga(acac)$_3$), 0.15 mmol of 1,3-dimethylthiourea, and 36.5 mmol of tetradecylamine were measured, to which a hexane dispersion of the above synthesized semiconductor nanoparticles was added as the core particle dispersion at a nanoparticle concentration of 30 nmol. The reaction vessel was degassed to volatilize and remove hexane, and replaced with a nitrogen atmosphere, and then heated to 50° C. to melt tetradecylamine. Subsequently, the temperature was raised at 10° C./min until reaching 270° C., and then heat-treatment was carried out at 270° C. for 60 min. This was then left to cool to about 60° C., and after adding 3 mL of hexane, coarse particles were removed by centrifugation. Methanol was then added to the supernatant, and after washing, the resultant core-shell semiconductor nanoparticles were dispersed in 3 mL of hexane.

Modification Step

The solvent in the obtained dispersion of the core-shell semiconductor nanoparticles was replaced with chloroform, and then a portion was separated. After adding and mixing its equal amount of n-trioctylphosphine (TOP), the dispersion was left standing at room temperature for 24 hours to obtain TOP-modified core-shell semiconductor nanoparticles.

Measurement of Absorption and Emission Spectra, and Quantum Yield

Figure 18:
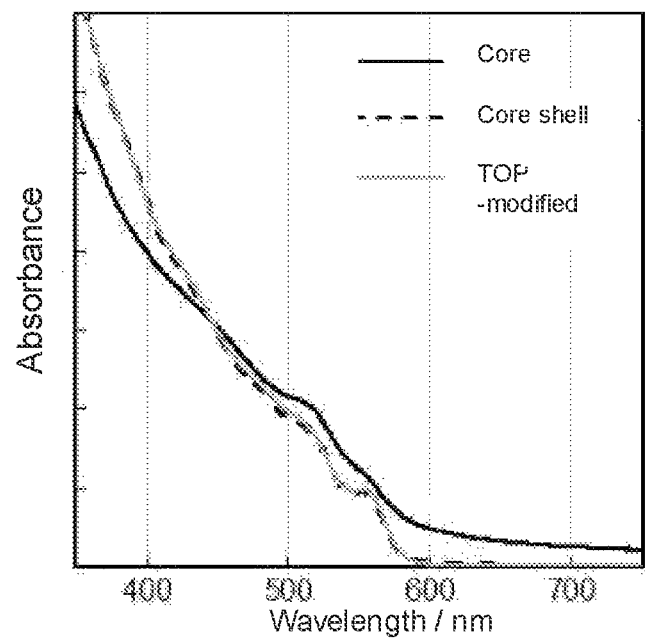
FIG. 18 shows exemplary absorption spectra of semiconductor nanoparticles according to Example 7.
Figure 19:
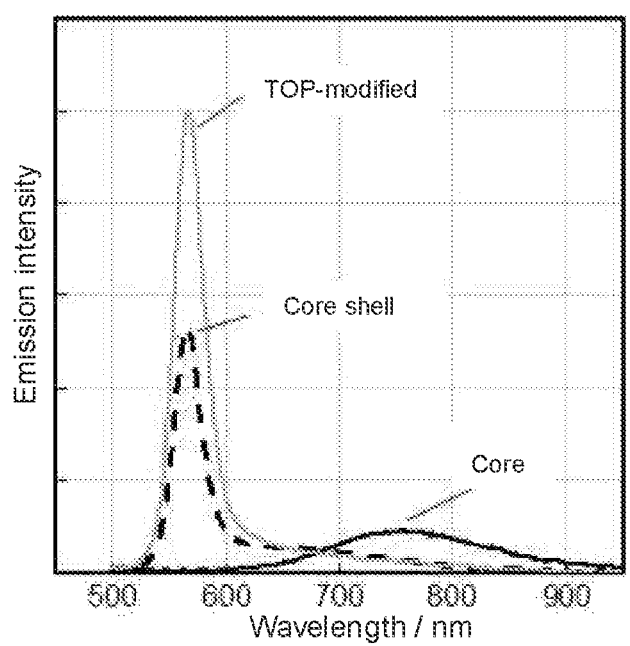
FIG. 19 shows exemplary emission spectra of semiconductor nanoparticles according to Example 7.

Absorption and emission spectra of the semiconductor nanoparticles, core-shell semiconductor nanoparticles and TOP-modified core-shell semiconductor nanoparticles were measured. The results are shown in FIGS. 18 and 19. The absorption spectra were measured using a UV-Vis-NIR spectrophotometer (Hitachi, trade name: U-2900) in a wavelength range of from 350 nm to 750 nm. The emission spectra and emission quantum yields were measured using a quantum yield measurement system (manufactured by Otsuka electron, trade name: QE-2100) at room temperature (25° C.) with an excitation wavelength of 450 nm, and measured and calculated in the wavelength range of from 500 nm to 950 nm.

As shown in FIG. 18, in the absorption spectrum of the core-shell semiconductor nanoparticles, shoulders were observed at around 515 nm and 560 nm, suggesting that there is an exciton peak at around from 400 nm to 600 nm. In addition, as shown in FIG. 19, a band edge emission with a half bandwidth of about 28 nm was observed at around 567 nm, wherein the quantum yield was 28.3%, and the purity of the band edge emission component was 55.9%. In the emission spectrum of the TOP-modified core-shell semiconductor nanoparticles, a band edge emission with a half bandwidth of about 30 nm was observed at around 569 nm, wherein the quantum yield of the band edge emission was 51.1%, and the purity of the band edge emission component was 71.0%.

The disclosures in Japanese Patent Application Publications No. 2019-021769 (filing date: Feb. 8, 2019) and No. 2019-153620 (filing date: Aug. 26, 2019) are incorporated herein by reference in their entireties. All documents, patent applications, and technical standards described herein are incorporated herein by reference to the same extent as in the case where the individual documents, patent applications, and technical standards are specifically and individually noted as being incorporated by reference.

The invention claimed is:

1. A method for producing a semiconductor nanoparticle, the method comprising:
   preparing a mixture containing an Ag salt, a salt containing at least one of In and Ga, and an organic solvent;
   raising a temperature of the mixture to a raised temperature in a range of from 120° C. to 300° C.; and
   adding a supply source of S to the mixture at the raised temperature in such a manner that a rate of increase in a ratio of a number of S atoms to a number of Ag atoms in the mixture is not more than 10/min.

2. The method according to claim 1, wherein the supply source of S is added over a period of from 15 min to 60 min.

3. The method according to claim 1, wherein the source of S is a solution containing sulfur or a sulfur-containing compound.

4. The method according to claim 1, further comprising heat-treating the mixture at a temperature in a range of from 120° C. to 300° C. after completing adding the source of S.

5. The method according to claim 1, wherein the rate of increase in the ratio of the number of S atoms to the number of Ag atoms in the mixture is from 0.0025/min to 0.19/min.

6. The method according to claim 1, further comprising separating a semiconductor nanoparticle from the mixture, purifying the semiconductor nanoparticle by adding an organic solvent, collecting the semiconductor nanoparticle, and dispersing the collected semiconductor nanoparticle in a halogen-containing solvent.

7. The method according to claim 1, further comprising disposing a shell containing a semiconductor that contains at least one Group 13 element and at least one Group 16 element on a surface of the semiconductor nanoparticle.

8. A method for producing a semiconductor nanoparticle, the method comprising:
preparing a mixture containing an Ag salt, a Cu salt, a salt containing at least one of In and Ga, and an organic solvent;
raising a temperature of the mixture to a raised temperature in a range of from 120° C. to 300° C.; and
adding a supply source of S to the mixture at the raised temperature in such a manner that a rate of increase in a ratio of a number of S atoms to a total number of Ag atoms and Cu atoms in the mixture is not more than 10/min.

9. The method according to claim 8, wherein a ratio of a number of the Cu atoms to the total number of the Ag atoms and the Cu atoms in the mixture is from 0.001 to 0.9.

10. The method according to claim 8, wherein a ratio of the total number of the Ag atoms and the Cu atoms to a total number of In atoms and Ga atoms in the mixture is from 0.1 to 2.

11. The method according to claim 8, wherein the supply source of S is added over a period of from 15 min to 60 min.

12. The method according to claim 8, wherein the source of S is a solution containing sulfur or a sulfur-containing compound.

13. The method according to claim 8, further comprising heat-treating the mixture at a temperature in a range of from 120° C. to 300° C. after completing adding the source of S.

14. The method according to claim 8, wherein the rate of increase in the ratio of the number of S atoms to the total number of the Ag atoms and the Cu atoms in the mixture is from 0.0025/min to 0.19/min.

15. The method according to claim 8, further comprising separating a semiconductor nanoparticle from the mixture, purifying the semiconductor nanoparticle by adding an organic solvent, collecting the semiconductor nanoparticle, and dispersing the collected semiconductor nanoparticle in a halogen-containing solvent.

16. The method according to claim 8, further comprising disposing a shell containing a semiconductor that contains at least one Group 13 element and at least one Group 16 element on a surface of the semiconductor nanoparticle.

17. A core-shell semiconductor nanoparticle, comprising:
a core containing a semiconductor nanoparticle comprising Ag, Cu, at least one of In and Ga, and S, wherein a ratio of a number of Cu atoms to a total number of Ag atoms and Cu atoms is from 0.001 to 0.9; and
a shell disposed on a surface of the core and containing a semiconductor material essentially consisting of at least one Group 13 element and at least one Group 16 element, and upon irradiation of light having a wavelength in a range of from 350 nm to less than 500 nm, emitting light having a peak emission wavelength in a range of from 500 nm to 820 nm and having a spectral half bandwidth of 250 meV or less.

18. The core-shell semiconductor nanoparticle according to claim 17, wherein the semiconductor nanoparticle has a ratio of a total number of In atoms and Ga atoms to the total number of the Ag atoms and the Cu atoms in a range of 0.5 to 10.

19. The core-shell semiconductor nanoparticle according to claim 17, wherein the semiconductor nanoparticle has a ratio of a number of S atoms to the total number of the Ag atoms and the Cu atoms in a range of 1 to 10.

20. A light-emitting device, comprising:
a light conversion member containing the core-shell semiconductor nanoparticle according to claim 17; and
a semiconductor light-emitting element.

21. The light-emitting device according to claim 20, wherein the semiconductor light-emitting element is an LED chip.

* * * * *